United States Patent
Ogura et al.

(10) Patent No.: US 8,440,781 B2
(45) Date of Patent: *May 14, 2013

(54) EPDXY RESIN COMPOSITION AND CURED ARTICLE THEREOF, SEMICONDUCTOR ENCAPSULATION MATERIAL, NOVEL PHENOL RESIN, AND NOVEL EPDOXY RESIN

(75) Inventors: Ichirou Ogura, Ichihara (JP); Yoshiyuki Takahashi, Ichihara (JP); Yutaka Sato, Ichihara (JP)

(73) Assignee: Dainippon Ink and Chemicals, Inc., Tokyo (JP)

( * ) Notice: Subject to any disclaimer, the term of this patent is extended or adjusted under 35 U.S.C. 154(b) by 297 days.

This patent is subject to a terminal disclaimer.

(21) Appl. No.: 12/634,259

(22) Filed: Dec. 9, 2009

(65) Prior Publication Data
US 2010/0087590 A1    Apr. 8, 2010

Related U.S. Application Data

(62) Division of application No. 11/817,535, filed as application No. PCT/JP2006/303902 on Mar. 1, 2006.

(30) Foreign Application Priority Data

| Mar. 2, 2005 | (JP) | 2005-057393 |
| Mar. 2, 2005 | (JP) | 2005-057394 |
| Sep. 5, 2005 | (JP) | 2005-257056 |

(51) Int. Cl.
- C08G 65/48 (2006.01)
- C08G 65/38 (2006.01)
- C08L 61/00 (2006.01)
- C08L 61/06 (2006.01)
- C08L 63/00 (2006.01)

(52) U.S. Cl.
USPC ........... 528/212; 524/540; 525/481; 525/507

(58) Field of Classification Search .......... 525/481
See application file for complete search history.

(56) References Cited

U.S. PATENT DOCUMENTS
- 3,787,451 A   1/1974   Mah
- 4,464,521 A   8/1984   Gruber (Continued)

FOREIGN PATENT DOCUMENTS
- JP   04-277518 A   10/1992
- JP   8-301980 A    11/1996

(Continued)

OTHER PUBLICATIONS

English translation of JP 2004-010700 A, Taihichi et al, Jan. 15, 2004.*

(Continued)

*Primary Examiner* — Peter F Godenschwager
*Assistant Examiner* — David Karst
(74) *Attorney, Agent, or Firm* — Westerman, Hattori, Daniels & Adrian, LLP

(57) ABSTRACT

The object of the present invention is to provide an epoxy resin composition capable of realizing low dielectric constant and low dielectric dissipation factor, which is suited for use as a latest current high-frequency type electronic component-related material, without deteriorating heat resistance during the curing reaction. A phenol resin, which has the respective structural units of a phenolic hydroxyl group-containing aromatic hydrocarbon group (P) derived from phenols, an alkoxy group-containing condensed polycyclic aromatic hydrocarbon group (B) derived from methoxynaphthalene and a divalent hydrocarbon group (X) such as methylene and also has a structure represented by -P-B-X- wherein P, B and X are structural sites of these groups in a molecular structure, is used as a curing agent for the epoxy resin, or a phenol resin as an epoxy resin material.

8 Claims, 16 Drawing Sheets

U.S. PATENT DOCUMENTS

| | | | |
|---|---|---|---|
| 5,597,876 A * | 1/1997 | Murata et al. | 525/481 |
| 5,677,397 A | 10/1997 | Nakamura et al. | |
| 6,117,536 A * | 9/2000 | Poutasse | 428/301.1 |
| 6,777,464 B1 | 8/2004 | Watanabe et al. | |
| 6,784,228 B2 | 8/2004 | Ogura et al. | |
| 2002/0156189 A1 | 10/2002 | Ogura et al. | |
| 2004/0265596 A1 | 12/2004 | Maeda | |

FOREIGN PATENT DOCUMENTS

| | | |
|---|---|---|
| JP | 11-140167 A | 5/1999 |
| JP | 2000-212238 A | 8/2000 |
| JP | 2001-64340 A | 3/2001 |
| JP | 2003-201333 A | 7/2003 |
| JP | 2004-10700 A | 1/2004 |
| JP | 2004010700 A * | 1/2004 |

OTHER PUBLICATIONS

Supplementary European Search Report dated Apr. 6, 2009, issued in European Patent Application No. 05776808.7.
International Search Report of PCT/JP2005/015867, dated Nov. 8, 2005.
Non-Final Office Action dated Mar. 8, 2010 issued in U.S. Appl. No. 11/817,535 of U.S. Appl. No. 11/817,535, filed Sep. 9, 2008.
International Search Report of PCT/JP2006/303902, mailing date of Apr. 18, 2006.
European Search Report dated Apr. 6, 2009, issued in corresponding European Patent Application No. 06715019.3.
Taiwanese Office Action dated Aug. 10, 2012, issued in corresponding Taiwanese Patent Application No. 095106815, (12 pages). With English Translation.
US 6,221,980, 04/2001, Ohashi et al. (withdrawn)

* cited by examiner

EPDXY RESIN COMPOSITION AND CURED ARTICLE THEREOF, SEMICONDUCTOR ENCAPSULATION MATERIAL, NOVEL PHENOL RESIN, AND NOVEL EPDOXY RESIN

CROSS-REFERENCE TO RELATED APPLICATIONS

This application is a Divisional of application Ser. No. 11/817,535, filed Sep. 9, 2008, and wherein application Ser. No. 11/817,535 is a national stage application filed under 35 USC §371 of International Application No. PCT/JP2006/303902, filed Mar. 1, 2006, the entire contents of which are incorporated herein by reference.

TECNICL FIELD

The present invention relates to an epoxy resin composition which is excellent in heat resistance, dielectric characteristics and curability during the curing reaction of the resulting cured article and can be suited for use in applications such as semiconductor encapsulation materials, printed circuit boards, coating materials and castings, and to a cured article thereof, a novel phenol resin and a novel epoxy resin.

BACKGROUND ART

An epoxy resin composition containing an epoxy resin and a curing agent thereof as essential components are widely used in electronic and electric components such as semiconductor encapsulation materials and printed circuit boards, conductive adhesives such as conductive pastes, other adhesives, matrixes for composite materials, coating materials, photoresist materials and developing materials because of excellent various physical properties such as heat resistance, moisture resistance and low viscosity.

In these various applications, particularly advanced materials, it has recently been required to further improve performances typified by heat resistance and moisture resistance. For example, in the field of semiconductor encapsulation materials, a reflow treatment temperature increased due to shift to surface mounting packages such as BGA and CSP and correspondence to lead-free solders, and thus electronic component encapsulation resin materials having excellent moisture soldering resistance are more required than before.

As the technique for producing electronic component encapsulation resin materials which meet such requirements, for example, there is known a technique in which fluidity is improved by using, as a curing agent for epoxy resin, a methoxy group-containing phenol resin obtained by methoxylating a phenolic hydroxyl group in a resol resin and converting the methoxylated resol resin into a novolak resin in the presence of an acid catalyst and also proper flexibility is imparted to the cured article, and thus moisture resistance and impact resistance of the cured article itself are improved (see, for example, Japanese Unexamined Patent Application, First Publication No. 2004-10700).

However, such a curing agent for epoxy resin is inferior in heat resistance because of small number of functional groups per molecule. In the field of electronic components, it is of urgent necessity to develop a high-frequency device capable of coping with higher frequency and materials having low dielectric constant and low dielectric dissipation factor are required to electronic component-related materials such as semiconductor encapsulation materials. The cured article obtained by using the methoxy group-containing phenol resin as the curing agent for epoxy resin has less crosslink points and therefore dielectric characteristics are improved to some extent, however, dielectric constant and dielectric dissipation factor do not attain the level which has recently been required.

As described above, in the field of electronic component-related materials, there has never been obtained an epoxy resin composition capable of coping with recent higher frequency without causing deterioration of heat resistance.

DISCLOSURE OF THE INVENTION

Therefore, an object to be attained by the present invention is to provide an epoxy resin composition capable of realizing low dielectric constant and low dielectric dissipation factor, which is suited for use as a latest high frequency type electronic component-related material, without deteriorating heat resistance during the curing reaction and a cured article thereof, a novel epoxy resin which impart these performances, and a novel phenol resin.

The present inventors have intensively studied so as to attain the above object and found that the dielectric constant and the dielectric dissipation factor can be remarkably decreased while maintaining excellent heat resistance by introducing an alkoxynaphthalene structure into a phenol novolak resin or novolak type epoxy resin skeleton, and thus the present invention has been completed.

The present invention relates to an epoxy resin composition (hereinafter, this epoxy resin composition is abbreviated to "epoxy resin composition (I)") including an epoxy resin and a curing agent as essential components, wherein the curing agent is a phenol resin which has the respective structural units of:

a phenolic hydroxyl group-containing aromatic hydrocarbon group (P), an alkoxy group-containing condensed polycyclic aromatic hydrocarbon group (B), and a divalent hydrocarbon group (X) selected from methylene, an alkylidene group and an aromatic hydrocarbon structure-containing methylene group, and the phenol resin has, in a molecular structure, a structure in which the phenolic hydroxyl group-containing aromatic hydrocarbon group (P) and the alkoxy group-containing condensed polycyclic aromatic hydrocarbon group (B) are bonded via the divalent hydrocarbon group (X) selected from methylene, the alkylidene group and the aromatic hydrocarbon structure-containing methylene group.

Also the present invention relates to an epoxy resin cured article obtained by curing epoxy resin composition (I).

Also the present invention relates to a novel phenol resin, including the respective structural units of:

a phenolic hydroxyl group-containing aromatic hydrocarbon group (P), an alkoxy group-containing condensed polycyclic aromatic hydrocarbon group (B), and a divalent hydrocarbon group (X) selected from methylene, an alkylidene group and an aromatic hydrocarbon structure-containing methylene group, wherein the phenol resin has, in a molecular structure, a structure in which the phenolic hydroxyl group-containing aromatic hydrocarbon group (P) and the alkoxy group-containing condensed polycyclic aromatic hydrocarbon group (B) are bonded via the divalent hydrocarbon group (X) selected from methylene, the alkylidene group and the aromatic hydrocarbon structure-containing methylene group, and the phenol resin has a melt viscosity at 150° C., as measured by an ICI viscometer, of 0.1 to 5.0 dPa·s and a hydroxyl group equivalent of 120 to 500 g/eq.

Also the present invention relates to an epoxy resin composition (hereinafter, this epoxy resin composition is abbreviated to "epoxy resin composition (II)") including an epoxy resin and a curing agent as essential components, wherein the epoxy resin has the respective structural units of:

a glycidyloxy group-containing aromatic hydrocarbon group (E), an alkoxy group-containing condensed polycyclic aromatic hydrocarbon group (B), and a divalent hydrocarbon group (X) selected from methylene, an alkylidene group and an aromatic hydrocarbon structure-containing methylene, and the epoxy resin has, in a molecular structure, a structure in which the glycidyloxy group-containing aromatic hydrocarbon group (E) and the alkoxy group-containing condensed polycyclic aromatic hydrocarbon group (B) are bonded via the methylene group (X).

Also the present invention relates to a novel epoxy resin, including the respective structural units of:

a glycidyloxy group-containing aromatic hydrocarbon group (E), an alkoxy group-containing condensed polycyclic aromatic hydrocarbon group (B), and a divalent hydrocarbon group (X) selected from methylene, an alkylidene group and an aromatic hydrocarbon structure-containing methylene group, wherein the epoxy resin has, in a molecular structure, a structure in which the glycidyloxy group-containing aromatic hydrocarbon group (E) and the alkoxy group-containing condensed polycyclic aromatic hydrocarbon group (B) are bonded via the methylene group (X), and the epoxy resin has a melt viscosity at 150° C., measured by an ICI viscometer, of 0.1 to 5.0 dPa·s and an epoxy group equivalent of 200 to 500 g/eq.

Also the present invention relates to a semiconductor encapsulation material, including epoxy resin composition (I) or (II) which further contains, in addition to the epoxy resin and the curing agent, an inorganic filler within a range of 70 to 95% by mass with respect to the epoxy resin composition.

According to the present invention, there can be provided an epoxy resin composition capable of realizing low dielectric constant and low dielectric dissipation factor, which is suited for use as a latest high-frequency type electronic component-related material, while maintaining excellent heat resistance of a cured article and a cured article thereof, a novel phenol resin which imparts these performances, and a novel epoxy resin.

BEST MODE FOR CARRYING OUT THE INVENTION

Figure 1:
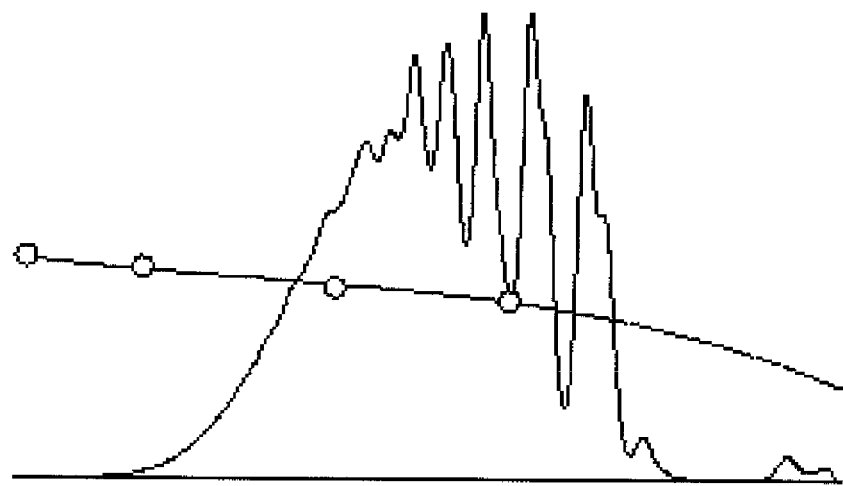
FIG. 1 is a graph showing a GPC chart of a phenol resin obtained in Example 1.

The present invention will now be described in detail.

Epoxy resin composition (I) of the present invention includes an epoxy resin and a curing agent as essential components, wherein the curing agent is a phenol resin which has the respective structural units of a phenolic hydroxyl group-containing aromatic hydrocarbon group (P), an alkoxy group-containing condensed polycyclic aromatic hydrocarbon group (B), and a divalent hydrocarbon group (X) selected from methylene, an alkylidene group and an aromatic hydrocarbon structure-containing methylene group, and which also has, in a molecular structure, a structure in which the phenolic hydroxyl group-containing aromatic hydrocarbon group (P) and the alkoxy group-containing condensed polycyclic aromatic hydrocarbon group (B) are bonded via the divalent hydrocarbon group (X) selected from methylene, the alkylidene group and the aromatic hydrocarbon structure-containing methylene group.

That is, the phenol resin essentially includes a structural site represented by the following structural site A1:

[Chemical Formula 1]

$$-P-X-B- \quad\quad A1$$

wherein P is a structural unit of the phenolic hydroxyl group-containing aromatic hydrocarbon group (P), B is a structural unit of the alkoxy group-containing condensed polycyclic aromatic hydrocarbon group (B) and X is a structural unit of the divalent hydrocarbon group (X) (hereinafter each group is abbreviated to "methylene group (X)" or the like) selected from methylene, the alkylidene group and the aromatic hydrocarbon structure-containing methylene group, in a molecular structure.

In the present invention, because of such characteristic chemical structures, an aromatic content in the molecular structure increases, and excellent heat resistance is exhibited. Since a crosslink point in a cured article exists in the vicinity of an alkoxy group-containing condensed polycyclic aromatic hydrocarbon group (B), it is possible to reduce an adverse influence such as decrease in the dielectric constant and dielectric dissipation factor caused by a secondary hydroxyl group produced during curing, and thus excellent dielectric characteristics can be exhibited. It is worthy of special mention to exhibit excellent dielectric characteristics while introducing a functional group having comparatively high polarity such as alkoxy group.

The phenolic hydroxyl group-containing aromatic hydrocarbon group (P) can have various structures, and is preferably a phenol or naphthol represented by any one of the following structural formulas P1 to P16, or an aromatic hydrocarbon group formed from the phenol or the naphthol thereof, having an alkyl group as a substituent on the aromatic ring because of excellent dielectric performances.

[Chemical Formula 2]

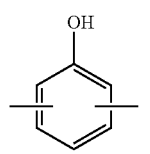
P1

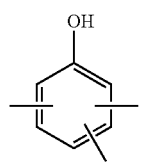
P2

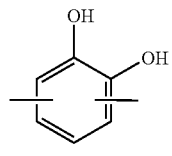
P3

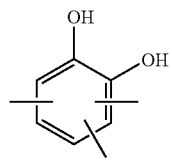
P4

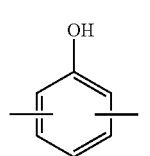
P5

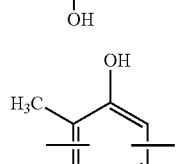
P6

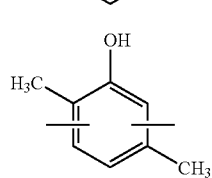
P7

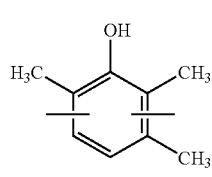
P8

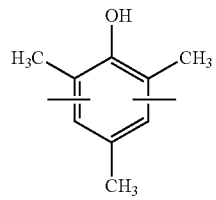
P9

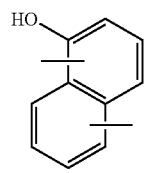
P10

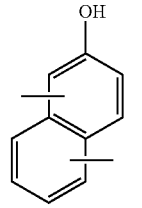
P11

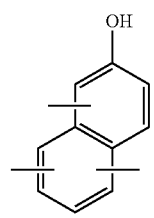
P12

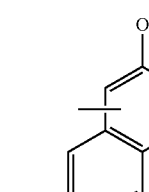
P13

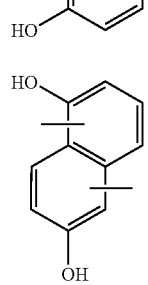
P14

P15

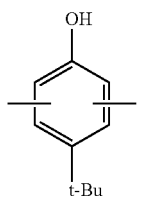
P16

When each of these structures is located at the molecular end, a monovalent aromatic hydrocarbon group is formed. Regarding those having at least two bonding sites with the other structural site on the naphthalene skeleton among these structures, these bonding sites may exist on the same or different nucleus.

Among the phenolic hydroxyl group-containing aromatic hydrocarbon groups (P) described above in detail, those having a methyl group as a substituent on the aromatic ring can impart excellent flame retardancy to an epoxy resin cured article itself, and it becomes possible to design a halogen-free material which has highly been required in the field of electronic components, recently.

Furthermore, the phenolic hydroxyl group-containing aromatic hydrocarbon groups (P) having a methyl group at the ortho-position of the phenol skeleton typified by those represented by the structural formulas P6, P7, P8 and P9 are preferable because a remarkable effect of improving heat resistance and dielectric characteristics of the cured article is exerted.

The alkoxy group-containing condensed polycyclic aromatic hydrocarbon group (B) contained in the phenol resin structure is a monovalent or polyvalent aromatic hydrocarbon group having an alkoxy group as a substituent on the condensed polycyclic aromatic ring, and specific examples include alkoxynaphthalene type structures represented by the following structural formulas B1 to B15, or alkoxyanthracene represented by the following structural formula B16.

[Chemical Formula 3]

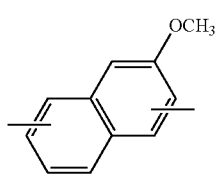
B1

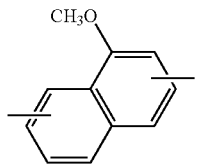
B2

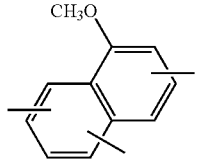
B3

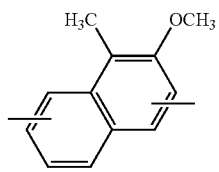
B4

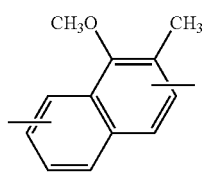
B5

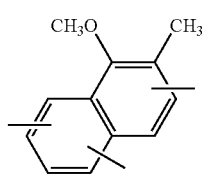
B6

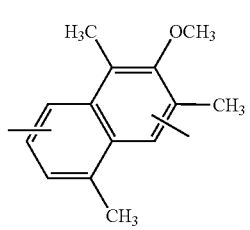
B7

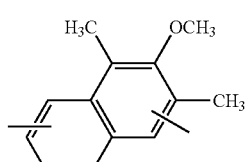
B8

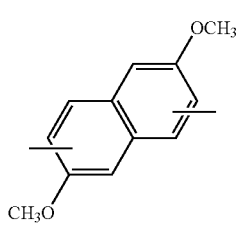
B9

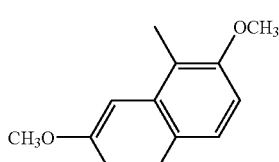
B10

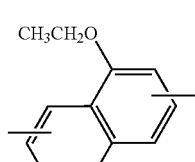
B11

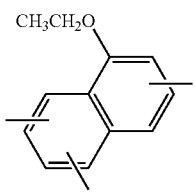
B12

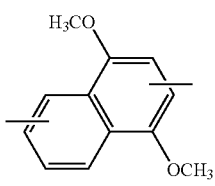
B13

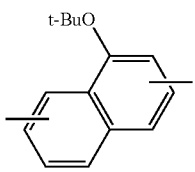
B14

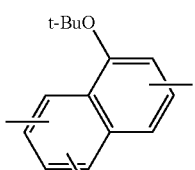
B15

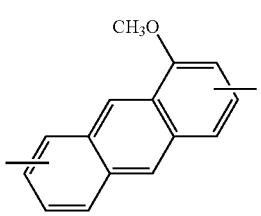
B16

When each structure is located at the molecular end, a monovalent aromatic hydrocarbon group is formed. Among the structures described above, the bonding site of those having at least two bonding sites with the other structural site on the naphthalene skeleton may exist on the same or different nucleus.

Among the alkoxy group-containing condensed polycyclic aromatic hydrocarbon groups (B) described above in detail, those having an alkoxynaphthalene type structure are preferable because the epoxy resin cured article is excellent in heat resistance. Aromatic hydrocarbon groups formed from naphthalene structures having a methoxy group or an ethoxy group as a substituent typified by those represented by the structural formulas B1 to B13, and a structure further having a methyl group as a substituent are preferable because the epoxy resin cured article is excellent in flame retardancy and it becomes possible to design a halogen-free material which has highly been required in the field of electronic components, recently.

Examples of the divalent hydrocarbon group (X) selected from methylene, alkylidene group and aromatic hydrocarbon structure-containing methylene group contained in the phenol resin structure include, in addition to methylene, alkylidene group such as ethylidene group, 1,1-propylidene group, 2,2-propylidene group, dimethylene group, propane-1,1,3,3-tetrayl group, n-butane-1,1,4,4-tetrayl group or n-pentane-1,1,5,5-tetrayl group. Examples of the aromatic hydrocarbon structure-containing methylene group include those having structures represented by the following formulas X1 to X9.

[Chemical Formula 4]

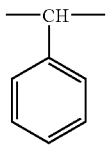
X1

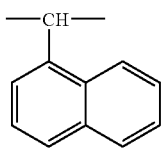
X2

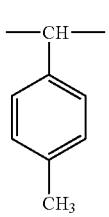
X3

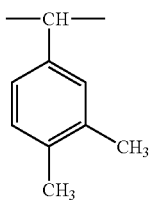
X4

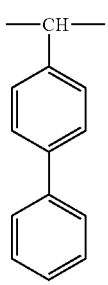
X5

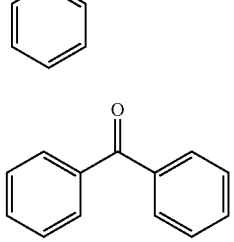
X6

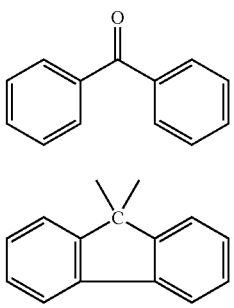
X7

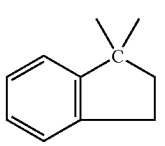
X8

-continued

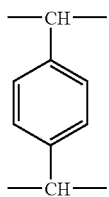
X9

Among these groups, methylene is particularly preferable because of excellent dielectric effect.

The phenol resin used in the present invention can employ any combination of the structures shown in the respective specific examples of the structural sites (P), (B) and (X). As described above, the molecular structure of the phenol resin composed of each structural site has essentially a structural site represented by the following structural site A1:
[Chemical Formula 5]

-P-X-B-    A1 wherein P is a structural unit of the phenolic hydroxyl group-containing aromatic hydrocarbon group (P), B is a structural unit of the alkoxy group-containing condensed polycyclic aromatic hydrocarbon group (B) and X is a structural unit of the methylene group (X) in a molecular structure. Further specific examples thereof include structures represented by the following structural formulas A2 and A3,
[Chemical Formula 6]

P-X-B-X-P    A2

B-X-P-X-P-X-B;    A3 structures having, at the molecular end of a novolak structure including, as a repeating unit, a structure represented by the following structural formula A4 or A5:

[Chemical Formula 7]

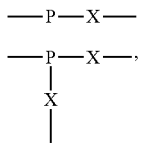

A4

A5 a structure represented by the following structural formula A6:
[Chemical Formula 8]

B-X-;    A6 or alternating copolymer structures including, as a repeating unit, structures represented by the following structural formulas A7 to A10:

[Chemical Formula 9]

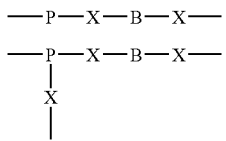

A7

A8

-continued

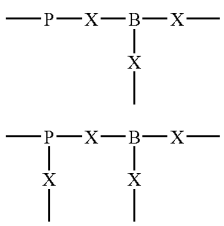

A9

A10

In the present invention, the phenol resin can have various structures, as described above, and the dielectric dissipation factor of the epoxy resin cured article can be remarkably decreased by having a structure represented by the above structural formula A6 at the molecular end. Therefore, a phenol resin having a structure of the structural formula A3, or a phenol resin including a repeating unit of the formula A4 or A7 and a structure represented by the structural formula A6 at the molecular end is preferable. A phenol resin having a structure of the structural formula A3 or a phenol resin including a repeating unit of the formula A4 and a structure represented by the structural formula A6 at the molecular end is particularly preferable because the effect of the present invention is remarkably excellent.

As described hereinafter, the phenol resin can be obtained by reacting a hydroxy group-containing aromatic compound (a1), an alkoxy group-containing aromatic compound (a2) and a carbonyl group-containing compound (a3) and, in addition to the above compounds of various structures, a compound represented by the following structural formula:

P-X-B    [Chemical Formula 10]

wherein P is a structural unit of a phenolic hydroxyl group-containing aromatic hydrocarbon group (P), B is a structural unit of an alkoxy group-containing condensed polycyclic aromatic hydrocarbon group (B) and X is a structural unit of a methylene group (X) is simultaneously produced and is contained in the phenol resin. In the present invention, it is preferred that the content of the compound is comparatively high, because melt viscosity of the phenol resin itself can be decreased and the resulting epoxy resin cured article is excellent in dielectric characteristics. Specifically, the content of the component is preferably within a range from 1 to 30% by mass based on the phenol resin. The content of the compound is preferably within a range from 3 to 25% by mass, and particularly preferably from 3 to 15% by mass, because such an effect is remarkably exerted.

Similarly, as a result of the reaction of the hydroxy group-containing aromatic compound (a1), the alkoxy group-containing condensed polycyclic aromatic compound (a2) and the carbonyl group-containing compound (a3), the phenol resin as the product sometimes contain a compound having a structure represented by the following structural formula B-X-B    [Chemical Formula 10]

wherein B is a structural unit of an alkoxy group-containing condensed polycyclic aromatic hydrocarbon group (B) and X is a structural unit of a methylene group (X). In the present invention, in view of heat resistance of the epoxy resin cured article, the content of the compound is preferably as small as possible, and it is more preferable that the phenol resin does not contain any compound. Therefore, the content of the compound in the phenol resin is preferably 5% by mass or less, more preferably 3% by mass or less, and particularly preferably 2% by mass or less.

The phenol resin preferably has a melt viscosity at 150° C., as measured by an ICI viscometer, within a range from 0.1 to 5.0 dPa·s because fluidity during molding and heat resistance of the cured article are excellent. Furthermore, the phenol resin more preferably has a hydroxyl group equivalent within a range from 120 to 500 g/eq. because flame retardancy and dielectric characteristics of the cured article are more improved. In the present invention, those having the hydroxyl group equivalent and melt viscosity within such a range are employed as the novel phenol resin of the present invention. When the hydroxyl group equivalent is within a range from 200 to 350 g/eq., balance between dielectric characteristics of the cured article and curability of the composition is particularly excellent.

In the phenol resin, a molar ratio of the phenolic hydroxyl group-containing aromatic hydrocarbon group (P) to the alkoxy group-containing condensed polycyclic aromatic hydrocarbon group (B), the former/the latter, is preferably within a range from 30/70 to 98/2 because flame retardancy and dielectric characteristics of the cured article are more improved.

The phenol resin can be produced by the method described below in detail. The method for producing a phenol resin will be described in detail.

The phenol resin can be produced by reacting a hydroxy group-containing aromatic compound (a1), an alkoxy group-containing aromatic compound (a2) and a carbonyl group-containing compound (a3).

It is worthy of special mention that the reaction proceeds without causing any hydrolysis, although the alkoxy group-containing aromatic compound (a2) is used as a raw material. An alkoxy group obtained by alkoxylating a phenolic hydroxyl group is widely used in a technique of protecting a phenolic hydroxyl group and is easily hydrolyzed in a strong acidic environment, while an alkoxy group can be introduced into a phenol resin structure without causing any hydrolysis in the present invention.

Specific examples of the hydroxy group-containing aromatic compound (a1) used in the above method for producing include unsubstituted phenols such as phenol, resorcinol and hydroquinone; monosubstituted phenols such as cresol, phenylphenol, ethylphenol, n-propylphenol, iso-propylphenol and t-butylphenol; disubstituted phenols such as xylenol, methylpropylphenol, methylbutylphenol, methylhexylphenol, dipropylphenol and dibutylphenol; trisubstituted phenols such as mesitol, 2,3,5-trimethylphenol and 2,3,6-trimethylphenol; and naphthols such as 1-naphthol, 2-naphthol and methylnaphthol.

These compounds may be used in combination.

Among these compounds, as described above, 1-naphthol, 2-naphthol, cresol and phenol are particularly preferable in view of dielectric characteristics and flame retardancy of the cured article.

Specific examples of the alkoxy group-containing aromatic compound (a2) include 1-methoxynaphthalene, 2-methoxynaphthalene, 1-methyl-2-methoxynaphthalene, 1-methoxy-2-methylnaphthalene, 1,3,5-trimethyl-2-methoxynaphthalene, 2,6-dimethoxynaphthalene, 2,7-dimethoxynaphthalene, 1-ethoxynaphthalene, 1,4-dimethoxynaphthalene, 1-t-butoxynaphthalene and 1-methoxyanthracene.

Among these compounds, 2-methoxynaphthalene and 2,7-dimethoxynaphthalene are particularly preferable because an alkoxynaphthalene skeleton is easily formed at the molecular end, and 2-methoxynaphthalene is particularly preferable in view of dielectric characteristics.

Specific examples of the carbonyl group-containing compound (a3) include aliphatic aldehydes such as formaldehyde, acetaldehyde and propionaldehyde; dialdehydes such as glyoxal; aromatic aldehydes such as benzaldehyde, 4-methylbenzaldehyde, 3,4-dimethylbenzaldehyde, 4-biphenylaldehyde and naphthylaldehyde; and ketone compounds such as benzophenone, fluorenone and indanone.

Among these compounds, formaldehyde, benzaldehyde, 4-biphenylaldehyde and naphthylaldehyde are preferable because the resulting cured article is excellent in flame retardancy, and formaldehyde is particularly preferable because of excellent dielectric characteristics.

Examples of the method of reacting the hydroxy group-containing aromatic compound (a1), the alkoxy group-containing condensed polycyclic aromatic compound (a2) and the carbonyl group-containing compound (a3) include:

1) a method of charging a hydroxy group-containing aromatic compound (a1), an alkoxy group-containing condensed polycyclic aromatic compound (a2) and a carbonyl group-containing compound (a3), substantially simultaneously, and reacting them while stirring with heating in the presence of a proper polymerization catalyst, 2) a method of reacting 1 mol of an alkoxy group-containing condensed polycyclic aromatic compound (a2) with 0.05 to 30 mols, preferably 2 to 30 mols of a carbonyl group-containing compound (a3), charging a hydroxy group-containing aromatic compound (a1) and reacting with the reaction product, and 3) a method of previously mixing a hydroxy group-containing aromatic compound (a1) with an alkoxy group-containing condensed polycyclic aromatic compound (a2), continuously or intermittently adding a carbonyl group-containing compound (a3) in the system, and reacting with the reaction product. As used herein, substantially simultaneously means that all materials are charged until the reaction is accelerated by heating.

Among these methods, the methods 1) and 3) are preferable because it is possible to control the content of a compound having a structure represented by the following structural formula:

 P-X-B          [Chemical Formula 12]

and to satisfactorily suppress the production of a compound having a structure represented by the following structural formula:

 B-X-B          [Chemical Formula 13]

The polymerization catalyst used herein is not specifically limited and an acid catalyst is preferable, and examples thereof include inorganic acids such as hydrochloric acid, sulfuric acid and phosphoric acid; organic acids such as methanesulfonic acid, p-toluenesulfonic acid and oxalic acid; and Lewis acids such as boron trifluoride, anhydrous aluminum chloride and zinc chloride. The content of the polymerization catalyst is preferably within a range from 0.1 to 5% by mass based on the total mass of the materials to be charged.

A ratio of the hydroxy group-containing aromatic compound (a1), the alkoxy group-containing condensed polycyclic aromatic compound (a2) and the carbonyl group-containing compound (a3) to be charged in the reaction is not specifically limited. A molar ratio of the hydroxy group-containing aromatic compound (a1) to the alkoxy group-containing aromatic compound (a2), (a1)/(a2), is preferably within a range from 30/70 to 98/2 and a ratio of the total number of mols of the hydroxy group-containing aromatic compound (a1) and the alkoxy group-containing condensed polycyclic aromatic compound (a2) to the number of mols of the carbonyl group-containing compound (a3), {(a1)+(a2)}/(a3), is preferably within a range from 51/49 to 97/3.

To control the content of the compound having a structure represented by the following structural formula:

P-X-B　　　　　　　　　　　　　　　　[Chemical Formula 14]

and the content of the compound having a structure represented by the following structural formula:

B-X-B　　　　　　　　　　　　　　　　[Chemical Formula 15]

in the phenol resin produced by the method 1) or 3), the molar ratio (a1)/(a2) is preferably 2 or more and the ratio {(a1)+(a2)}/(a3) is preferably within a range from 51/49 to 97/3.

When this reaction is conducted, an organic solvent can be used, if necessary. Examples of the usable organic solvent include, but are not limited to, methyl cellosolve, ethyl cellosolve, toluene, xylene and methyl isobutyl ketone. The content of the organic solvent is usually within a range from 10 to 500% by mass, and preferably from 30 to 250% by mass, based on the total mass of the materials to be charged. The reaction temperature is preferably within a range from 40 to 250° C., and more preferably from 100 to 200° C. The reaction time is usually within a range from 1 to 10 hours.

When the resulting polyvalent hydroxy compound shows high degree of coloration, antioxidants and reducing agents may be added so as to suppress coloration. Examples of the antioxidant include, but are not limited to, hindered phenolic compounds such as 2,6-dialkylphenol derivative; divalent sulfur-based compounds; and phosphite ester-based compounds containing a trivalent phosphorus atom. Examples of the reducing agent include, but are not limited to, hypophosphorous acid, phosphorous acid, thiosulfuric acid, sulfurous acid, hydrosulfite, or salts thereof and zinc.

After the completion of the reaction, the reaction mixture is subjected to neutralization or washing treatment until the pH value of the reaction mixture becomes the value within a range from 3 to 7, and preferably from 4 to 7. The neutralization or washing treatment may be conducted by a conventional method. For example, when an acid catalyst is used, basic substances such as sodium hydroxide, potassium hydroxide, sodium carbonate, ammonia, triethylenetetramine and aniline can be used as a neutralizer. In case of neutralization, buffers such as phosphoric acid may be previously mixed. Alternatively, the pH value may be adjusted to the value within a range from 3 to 7 with oxalic acid or the like after the pH is adjusted to the basic side. After subjecting to the neutralization or washing treatment, the unreacted material containing mainly the hydroxy group-containing aromatic compound (a1) and the alkoxy group-containing aromatic compound (a2), the organic solvent and by-product are distilled off while heating under reduced pressure and then the product is concentrated, and thus the objective polyvalent hydroxy compound can be obtained. The unreacted material thus recovered can be reused. After the completion of the reaction, when a precise filtration step is introduced into the treating operation, inorganic salts and foreign matters can be removed by purification, and therefore this method is preferable.

In epoxy resin composition (I) of the present invention, the phenol resin may be used alone, or used in combination with the other curing agent as far as the effects of the present invention are not adversely affected. Specifically, the other curing agent can be used in combination so that the content of the phenol resin is 30% by mass or more, and preferably 40% by mass or more, based on the total mass of the curing agent.

Examples of the other curing agent which can used in combination with the phenol resin of the present invention include, but are not limited to, amine-based compounds, amide-based compounds, acid anhydride-based compounds, phenolic compounds other than the above phenol resins, and polyvalent phenol compounds of aminotriazine-modified phenol resins (polyvalent phenol compounds in which phenol nuclei are connected with melamine or benzoguanamine).

Among these, phenol novolak resin, cresol novolak resin, aromatic hydrocarbon formaldehyde resin-modified phenol resin, phenol aralkyl resin, naphthol alaralkyl resin, naphthol novolak resin, naphthol-phenol co-condensed novolak resin, naphthol-cresol co-condensed novolak resin, biphenyl-modified phenol resin, biphenyl-modified naphthol resin and aminotriazine-modified phenol resin are preferable because of excellent flame retardancy, and compounds, for example, phenol resins having high aromatic properties and high hydroxyl group equivalent such as phenol aralkyl resin, naphthol aralkyl resin, biphenyl-modified phenol resin and biphenyl-modified naphthol resin, and aminotriazine-modified phenol resins having a nitrogen atom are used particularly preferably because the resulting cured article is excellent in flame retardancy and dielectric characteristics.

Examples of the epoxy resin (B) used in epoxy resin composition (I) of the present invention include bisphenol A type epoxy resin, bisphenol F type epoxy resin, biphenyl type epoxy resin, tetramethylbiphenyl type epoxy resin, phenol novolak type epoxy resin, cresol novolak type epoxy resin, bisphenol A novolak type epoxy resin, triphenylmethane type epoxy resin, tetraphenylethane type epoxy resin, dicyclopentadiene-phenol addition reaction type epoxy resin, phenol aralkyl type epoxy resin, naphthol novolak type epoxy resin, naphtholaralkyl type epoxy resin, naphthol-phenol co-condensed novolak type epoxy resin, naphthol-cresol co-condensed novolak type epoxy resin, aromatic hydrocarbon formaldehyde resin-modified phenol resin type epoxy resin and biphenyl novolak type epoxy resin. These epoxy resins may be used alone or in combination.

Among these epoxy resins, biphenyl type epoxy resin, naphthalene type epoxy resin, phenol aralkyl type epoxy resin, biphenyl novolak type epoxy resin and xanthene type epoxy resin are particularly preferable because of excellent flame retardancy and dielectric characteristics.

The contents of the epoxy resin (B) and the curing agent in epoxy resin composition (I) of the present invention are not specifically limited. The content of an active group in the curing agent containing the phenol resin (A) is preferably within a range from 0.7 to 1.5 equivalents based on 1 equivalent of the total of epoxy groups of the epoxy resin (B) because the resulting cured article is excellent in characteristics.

If necessary, curing accelerators can also be added to epoxy resin composition (I) of the present invention. Various curing accelerators can be used and examples thereof include phosphorous-based compound, tertiaryamine, imidazole, organic acid metal salt, Lewis acid and amine complex salt. When used as semiconductor encapsulation materials, triphenylphosphine is preferable in case of a phosphorous-based compound and 1,8-diazabicyclo-[5.4.0]-undecene (DBU) is preferable in case of a tertiary amine because of excellent curability, heat resistance, electrical characteristics and moisture resistant reliability.

Another epoxy resin composition (II) of the present invention is an epoxy resin composition including an epoxy resin and a curing agent as essential components, wherein the epoxy resin has the respective structural units of:

a glycidyloxy group-containing aromatic hydrocarbon group (E), an alkoxy group-containing condensed polycyclic aromatic hydrocarbon group (B), and a divalent hydrocarbon group (X) selected from methylene, an alkylidene group and an aromatic hydrocarbon structure-containing methylene group, and also has, in a molecular structure, a structure in which the glycidyloxy group-containing aromatic hydrocarbon group (E) and the alkoxy group-containing condensed polycyclic aromatic hydrocarbon group (B) are bonded via the divalent hydrocarbon group (X) selected from methylene, the alkylidene group and the aromatic hydrocarbon structure-containing methylene group.

That is, the epoxy resin in epoxy resin composition (II) is obtained by reacting a phenol resin constituting epoxy resin composition (I) with epihalohydrin, thereby epoxidating the phenol resin, and has a basic skeleton common to the phenol resin. Therefore, similar to the case of the phenol resin, the aromatic content in the molecular structure increases and excellent heat resistance is imparted to the cured article and also the concentration of the epoxy group can be appropriately decreased and the alkoxy group is contained in the molecular structure, and thus the dielectric constant and dielectric dissipation factor of the cured article can be decreased.

Similar to the phenol resin, the epoxy resin essentially contains, in a molecular structure, a structural site represented by the following structural site Y1:
[Chemical Formula 16]

-E-X-B-     Y1 wherein E is a structural unit of the glycidyloxy group-containing aromatic hydrocarbon group (E), B is a structural unit of the alkoxy group-containing condensed polycyclic aromatic hydrocarbon group (B) and X is a structural unit of the methylene group (X).

In the present invention, because of a characteristic chemical structure, an aromatic content in the molecular structure increases and excellent heat resistance is exhibited. Since a crosslink point in a cured article exists in the vicinity of an alkoxy group-containing condensed polycyclic aromatic hydrocarbon group (B), it is possible to reduce an adverse influence such as decrease in the dielectric constant and dielectric dissipation factor caused by a secondary hydroxyl group produced during curing, and thus excellent dielectric characteristics can be exhibited. It is worthy of special mention to exhibit excellent dielectric characteristics while introducing a functional group having comparatively high polarity such as alkoxy group.

The glycidyloxy group-containing aromatic hydrocarbon group (E) is not specifically limited and preferred examples thereof include aromatic hydrocarbon groups represented by the following structural formulas E1 to E16 because of excellent dielectric performances.

[Chemical Formula 17]

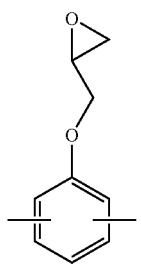
E1

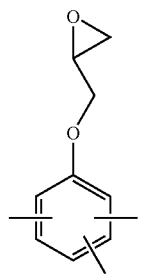
E2

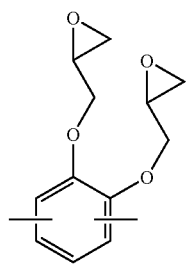
E3

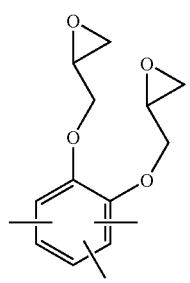
E4

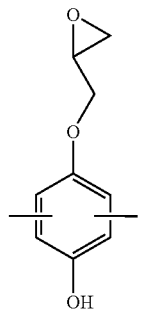
E5

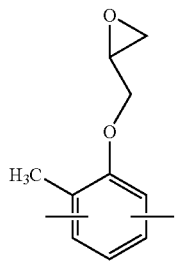
E6

E7 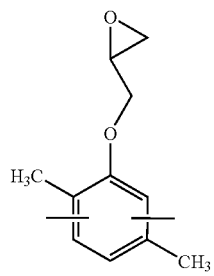
E8 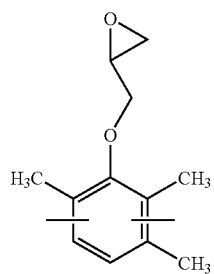
E9 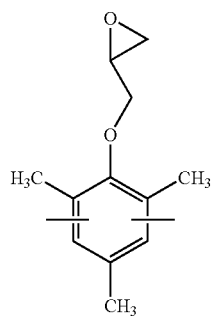
E10 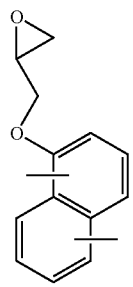
E11 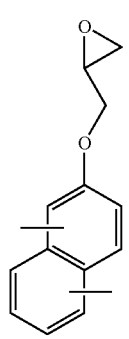
E12 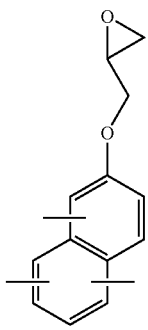
E13 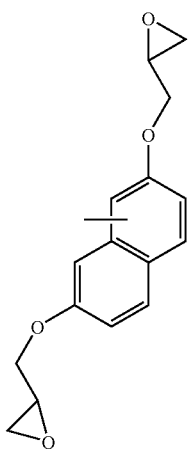
E14 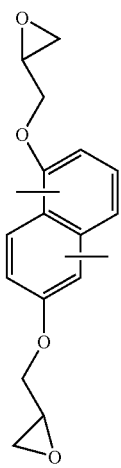

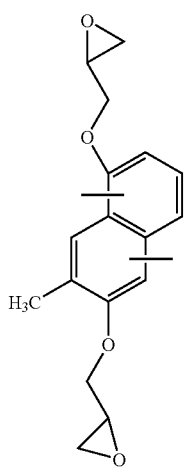

E15

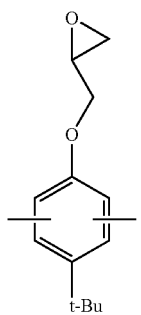

E16

When each structure is located at the molecular end, a monovalent aromatic hydrocarbon group is formed. Among the structures described above, the bonding site of those having at least two bonding sites with the other structural site on the naphthalene skeleton may exist on the same or different nucleus.

Among the glycidyloxy group-containing aromatic hydrocarbon groups (E) described above in detail, those having a methyl group as a substituent on the aromatic ring can impart excellent flame retardancy to an epoxy resin cured article itself and it becomes possible to design a halogen-free material which has highly been required in the field of electronic components, recently.

Furthermore, the glycidyloxy group-containing aromatic hydrocarbon groups (E) having a methyl group at the ortho-position of the phenol skeleton typified by those represented by the structural formulas E6, E7, E8 and E9 are preferable because a remarkable effect of improving heat resistance and dielectric characteristics of the cured article is exerted.

The alkoxy group-containing condensed polycyclic aromatic hydrocarbon group (B) contained in the epoxy resin structure is specifically the same as that in the phenol resin of the above epoxy resin composition (I).

The methylene group (X) contained in the epoxy resin structure is specifically the same as that in the phenol resin of the above epoxy resin composition (I).

The epoxy resin used in the present invention can employ any combination of the structures shown in the respective specific examples of the structural sites (E), (B) and (X). As described above, the molecular structure of the phenol resin composed of each structural site has essentially a structural site represented by the following structural site Y1:

[Chemical Formula 18]

-E-X-B-    Y1 wherein E is a structural unit of the glycidyloxy group-containing aromatic hydrocarbon group (E), B is a structural unit of the alkoxy group-containing condensed polycyclic aromatic hydrocarbon group (B) and X is a structural unit of the methylene group (X) in a molecular structure. Specific examples thereof include structures represented by the following structural formulas Y2 and Y3,

[Chemical Formula 19]

E-X-B-X-E    Y2

B-X-E-X-E-X-B;    Y3 structures having, at the molecular end of a novolak structure including, as a repeating unit, a structure represented by the following structural formula Y4 or Y5:

[Chemical Formula 20]

$$—E—X—$$  Y4

$$\begin{array}{c}—E—X—,\\|\\X\\|\end{array}$$  Y5 a structure represented by the following structural formula A6:

[Chemical Formula 21]

B-X-;    A6 and alternating copolymer structure including, as a repeating unit, structures represented by the following structural formulas Y7 to Y10:

[Chemical Formula 21]

$$—E—X—B—X—$$  Y7

$$\begin{array}{c}—E—X—B—X—\\|\\X\\|\end{array}$$  Y8

$$\begin{array}{c}—E—X—B—X—\\|\\X\\|\end{array}$$  Y9

$$\begin{array}{c}—E—X—B—X—\\|\quad\quad|\\X\quad\quad X\\|\quad\quad|\end{array}$$  Y10

In the present invention, the epoxy resin can have various structures, as described above, and the dielectric dissipation factor of the epoxy resin cured article can be remarkably decreased by having a structure represented by the above structural formula A6 at the molecular end. Therefore, an epoxy resin having a structure of the structural formula Y3, or a phenol resin including a repeating unit of the formula Y4 or Y7 and a structure represented by the structural formula A6 at the molecular end is preferable. An epoxy resin having a structure of the structural formula Y3 or an epoxy resin including a repeating unit of the formula Y4 and a structure represented by the structural formula A6 at the molecular end is particularly preferable because the effect of the present invention is remarkably excellent.

As described hereinafter, the epoxy resin can be produced by reacting a hydroxy group-containing aromatic compound (a1), an alkoxy group-containing aromatic compound (a2) and a carbonyl group-containing compound (a3) and reacting the reaction product with epihalohydrin. In this case, since compounds of various structures are produced in the production of the phenol resin as a precursor of the epoxy resin, finally obtained epoxy resin contain compounds of various structures. In the present invention, a compound represented by the following structural formula:

E-X-B [Chemical Formula 23]

wherein E is a structural unit of a glycidyloxy group-containing aromatic hydrocarbon group (E), B is a structural unit of an alkoxy group-containing condensed polycyclic aromatic hydrocarbon group (B) and X is a structural unit of a methylene group (X) is simultaneously produced and is contained in the epoxy resin.

Similar to the above phenol resin, it is preferred that the content of the compound is comparatively high in view of melt viscosity and dielectric characteristics. The content of the compound is preferably within a range from 1 to 30% by mass, more preferably from 3 to 25% by mass, and particularly preferably from 3 to 15% by mass, based on the resin.

Similarly, since the epoxy resin is produced by reacting the hydroxy group-containing aromatic compound (a1), the alkoxy group-containing condensed polycyclic aromatic compound (a2) and the carbonyl group-containing compound (a3), the epoxy resin as the product sometimes contain a compound having a structure represented by the following structural formula:

B-X-B [Chemical Formula 24]

wherein B is a structural unit of an alkoxy group-containing condensed polycyclic aromatic hydrocarbon group (B) and X is a structural unit of a methylene group (X). In view of heat resistance of the epoxy resin cured article, the content of the compound is preferably as small as possible and it is more preferable that the epoxy resin does not contain any compound. Therefore, the content of the compound in the epoxy resin is preferably 5% by mass or less, more preferably 3% by mass or less, and particularly preferably 2% by mass or less.

The epoxy resin preferably has an epoxy group equivalent within a range from 200 to 500 g/eq. because flame retardancy and dielectric characteristics of the cured article are more improved. Furthermore, the epoxy resin preferably has a melt viscosity at 150° C., as measured by an ICI viscometer, within a range from 0.1 to 5.0 dPa·s because fluidity during molding and heat resistance of the cured article are excellent. In the present invention, those having the epoxy group equivalent and melt viscosity within such a range are employed as a novel epoxy resin of the present invention. When the epoxy group equivalent is within a range from 260 to 420 g/eq., balance between dielectric characteristics of the cured article and curability of the composition is particularly excellent.

In the epoxy resin, a ratio of the glycidyloxy group-containing aromatic hydrocarbon group (E) to the alkoxy group-containing condensed polycyclic aromatic hydrocarbon group (B), the former/the latter, is preferably within a range from 30/70 to 98/2 because flame retardancy and dielectric characteristics of the cured article are more improved.

The epoxy resin can be produced by the method described below in detail.

Specifically, the objective epoxy resin can be produced by producing a phenol resin in epoxy resin composition (I) by the above method and reacting the phenol resin with epihalohydrin. For example, there can be employed a method of adding 2 to 10 mols of epihalohydrin to 1 mol of a phenolic hydroxyl group in the phenol resin and reacting at a temperature of 20 to 120° C. for 0.5 to 10 hours while simultaneously or gradually adding 0.9 to 2.0 mols of a basic catalyst to 1 mol of a phenolic hydroxyl group. This basic catalyst may be used in the form of a solid or an aqueous solution. When using the aqueous solution, there can be used a method of continuously adding the aqueous solution, continuously distilling off water and epihalohydrins from the reaction mixture under reduced pressure or normal pressure, separating them, removing water and continuously returning epihalohydrins into the reaction mixture.

In case of industrial production, entire epihalohydrins used in an initial batch for production of the epoxy resin are new epihalohydrins. However, it is preferred to use epihalohydrin recovered from the crude reaction product in combination with new epihalohydrins corresponding the epihalohydrins consumed during the reaction in the following batches. At this time, the epihalohydrin to be used is not specifically limited and examples thereof include epichlorohydrin, epibromohydrin and β-methylepichlorohydrin. Among these epihalohydrins, epichlorohydrin is preferable because it is available with ease.

Specific examples of the basic catalyst include alkali earth metal hydroxide, alkali metal carbonic acid salt and alkali metal hydroxide. In view of excellent catalytic activity of the reaction for synthesis of an epoxy resin, alkali metal hydroxide is preferable and examples thereof include sodium hydroxide and potassium hydroxide. These basic catalysts may be used in the form of an aqueous solution having a concentration of about 10 to 55% by mass or a solid. The reaction rate in the synthesis of an epoxy resin can be increased by using in combination with an organic solvent. Examples of the organic solvent include, but are not limited to, ketones such as acetone and methyl ethyl ketone; alcohols such as methanol, ethanol, 1-propyl alcohol, isopropyl alcohol, 1-butanol, secondary butanol and tertiary butanol; cellosolves such as methyl cellosolve and ethyl cellosolve; ethers such as tetrahydrofuran, 1,4-dioxane, 1,3-dioxane and diethoxyethane; and aprotic polar solvents such as acetonitrile, dimethyl sulfoxide and dimethyl formamide. These organic solvent may be used alone, or may be used in combination so as to adjust polarity.

The reaction product of the above epoxydation reaction is washed with water and then the unreacted epihalohydrin and the organic solvent used in combination are distilled off by distillation with heating under reduced pressure. To obtain an epoxy resin containing a small amount of a hydrolyzable halogen, the resulting epoxy resin is dissolved in an organic solvent such as toluene, methyl isobutyl ketone or methyl ethyl ketone and an aqueous solution of an alkali metal hydroxide such as sodium hydroxide or potassium hydroxide is added and then the reaction can be further conducted. For the purpose of improving the reaction rate, the reaction can be conducted in the presence of a phase transfer catalyst such as quaternary ammonium salt or crown ether. In case of using the phase transfer catalyst, the amount is preferably within a range from 0.1 to 3.0% by mass based on the amount of the epoxy resin to be used. After the completion of the reaction, the resulting salt is removed by filtration or washing with water, and then the solvent such as toluene or methyl isobutyl ketone is distilled off with heating under reduce pressure to obtain a high-purity epoxy resin.

In epoxy resin composition of the present invention (II), the epoxy resin (A) obtained by the method of the present invention can be used alone or in combination with the other epoxy resin as far as the effects of the present invention are not adversely affected. When using in combination, the content of the epoxy resin of the present invention is preferably 30% by mass or more, and particularly preferably 40% by mass or more, based on the entire epoxy resin.

As the epoxy resin, which can be used in combination with the epoxy resin of the present invention, various epoxy resins can be used. Examples thereof include bisphenol A type epoxy resin, bisphenol F type epoxy resin, biphenyl type epoxy resin, tetramethylbiphenyl type epoxy resin, phenol novolak type epoxy resin, cresol novolak type epoxy resin, bisphenol A novolak type epoxy resin, triphenylmethane type epoxy resin, tetraphenylethane type epoxy resin, dicyclopentadiene-phenol addition reaction type epoxy resin, phenol aralkyl type epoxy resin, naphthol novolak type epoxy resin, naphthol aralkyl type epoxy resin, naphthol-phenol co-condensed novolak type epoxy resin, naphthol-cresol co-condensed novolak type epoxy resin, aromatic hydrocarbon formaldehyde resin-modified phenol resin type epoxy resin and biphenyl novolak type epoxy resin. Among these epoxy resins, a phenol aralkyl type epoxy resin, a biphenyl novolak type epoxy resin, a naphthol novolak type epoxy resin containing a naphthalene skeleton, a naphthol aralkyl type epoxy resin, a naphthol-phenol co-condensed novolak type epoxy resin, a naphthol-cresol co-condensed novolak type epoxy resin, a crystalline biphenyl type epoxy resin, a tetramethyl biphenyl type epoxy resin, and a xanthene type epoxy resin represented by the following structural formula:

hydrocarbon formaldehyde resin-modified phenol resin, dicyclopentadienephenol addition type resin, phenol aralkyl resin (popular name, xylok resin), naphthol aralkyl resin, trimethylolmethane resin, tetraphenylolethane resin, naphthol novolak resin, naphthol-phenol co-condensed novolak resin, naphthol-cresol co-condensed novolak resin, biphenyl-modified phenol resin (polyvalent phenol compound in which a phenol nucleus is connected through a bismethylene group), biphenyl-modified naphthol resin (polyvalent naphthol compound in which a phenol nucleus is connected through a bismethylene group), aminotriazine-modified phenol resin (polyvalent phenol compound in which phenol nucleus is connected through melamine or benzoguanamine).

Among these compounds, those containing a lot of aromatic skeletons in the molecular structure are preferable in view of the flame retardant effect and, for example, a phenol novolak resin, a cresol novolak resin, an aromatic hydrocarbon formaldehyde resin-modified phenol resin, a phenol aralkyl resin, a naphthol aralkyl resin, a naphthol novolak resin, a naphthol-phenol co-condensed novolak resin, a naphthol-cresol co-condensed novolak resin, a biphenyl-modified phenol resin, a biphenyl-modified naphthol resin and an aminotriazine-modified phenol resin are preferable because of excellent flame retardancy.

In the present invention, the above phenol resin used as an essential component in epoxy resin composition (I) is preferable and a novel phenol resin of the present invention is particularly preferable because a remarkable effect of decreasing the dielectric constant and dielectric dissipation factor is exerted. Furthermore, the phenol resin composed of an alkoxy group-containing condensed polycyclic aromatic

[Chemical Formula 25]

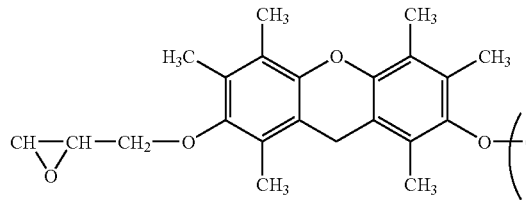 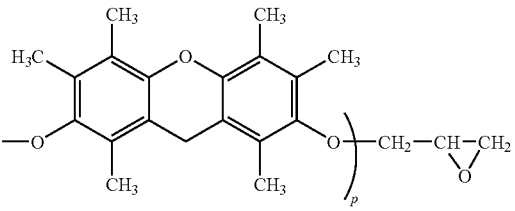

are particularly preferable because a cured article having excellent flame retardancy and dielectric characteristics can be obtained.

As the curing agent used in epoxy resin composition of the present invention (II), known various curing agents for epoxy resin such as amine-based compounds, amide-based compounds, acid anhydride-based compounds and phenolic compounds can be used. Specific examples of the amine-based compound include diaminodiphenylmethane, diethylenetriamine, triethylenetetramine, diaminodiphenylsulfon, isophoronediamine, imidazol, $BF_3$-amine complex and guanidine derivative; specific examples of the amide-based compound include dicyandiamide, and polyamide resin synthesized from a dimer of linolenic acid and ethylenediamine; specific examples of the acid anhydride-based compound include phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride and methylhexahydrophthalic anhydride; and specific examples of the phenol-based compound include polyvalent phenol compounds such as phenol novolak resin, cresol novolak resin, aromatic hydrocarbon group (B) represented by the structural formula (1'), a methylene group (X) represented by the structural formula (2') and a phenolic hydroxyl group-containing aromatic hydrocarbon group (P) represented by the formula (3) or (4) is particularly preferable because a remarkable flame retardant effect is exerted.

The contents of the epoxy resin and the curing agent in epoxy resin composition of the present invention (II) are not specifically limited. The content of an active group in the curing agent is preferably within a range from 0.7 to 1.5 equivalents based on 1 equivalent of the total of epoxy groups in the epoxy resin containing the epoxy resin because the resulting cured article is excellent in characteristics.

If necessary, curing accelerators can also be added to epoxy resin composition of the present invention (II). Various curing accelerators can be used and examples thereof include phosphorous-based compound, tertiary amine, imidazole, organic acid metal salt, Lewis acid and amine complex salt. When used as semiconductor encapsulation materials, triphenylphosphine is preferable in case of a phosphorous-based compound and 1,8-diazabicyclo-[5.4.0]-undecene (DBU) is preferable in case of a tertiary amine because of excellent curability, heat resistance, electrical characteristics and moisture resistant reliability.

In the above-described epoxy resin compositions (I) and (II) of the present invention, since the resin itself has an excellent effect of imparting flame retardancy according to selection of the molecular structure of the epoxy resin or a curing agent thereof, the cured article is excellent in flame retardancy even if a conventionally use flame retardant is not mixed. However, in order to exhibit more excellent flame retardancy, in the field of the semiconductor encapsulation material, a non-halogen flame retardant (C) containing substantially no halogen atom may be mixed as far as moldability in the encapsulation step and reliability of the semiconductor device are not deteriorated.

The epoxy resin composition containing such as non-halogen flame retardant (C) substantially contains no halogen atom, but may contain a trace amount (about 5000 ppm or less) of a halogen atom due to impurities derived from epihalohydrin contained in the epoxy resin.

Examples of the non-halogen flame retardant (C) include phosphorous-based flame retardant, nitrogen-based flame retardant, silicone-based flame retardant, inorganic-based flame retardant and organic metal salt-based flame retardant and these flame retardant are not specifically limited when used and may be used alone, or a plurality of the same flame retardants may be used or different flame retardants can be used in combination.

AS the phosphorous-based flame retardant, inorganic and organic flame retardants can be used. Examples of the inorganic compound include ammonium phosphates such as red phosphorus, monoammonium phosphate, diammonium phosphate, triammonium phosphate and ammonium polyphosphate; and inorganic nitrogen-containing phosphorus compounds such as phosphoric acid amide.

For the purpose of preventing hydrolysis of red phosphorus, it is preferably subjected to a surface treatment. Examples of the method of a surface treatment include (i) a method of coating with an inorganic compound such as magnesium hydroxide, aluminum hydroxide, zinc hydroxide, titanium hydroxide, bismuth oxide, bismuth hydroxide, bismuth nitrate or a mixture thereof, (ii) a method of coating with an inorganic compound such as magnesium hydroxide, aluminum hydroxide, zinc hydroxide or titanium hydroxide, and a mixture of a thermosetting resin such as phenol resin, (iii) and a method of double-coating a coating film made of an inorganic compound such as magnesium hydroxide, aluminum hydroxide, zinc hydroxide or titanium hydroxide with a thermosetting resin such as phenol resin.

Examples of the organic phosphorous-based compound include commodity organic phosphorous-based compounds such as phosphate ester compound, phosphonic acid compound, phosphinic acid compound, phosphine oxide compound, phospholan compound and organic nitrogen-containing phosphorus compound; cyclic organic phosphorus compounds such as 9,10-dihydro-9-oxa-10-phosphaphenanthrene=10-oxide, 10-(2,5-dihydrooxyphenyl)-10H-9-oxa-10-phsophaphenanthrene=10-oxide and 10(2,7-dihydrooxynaphthyl)-10H-9-oxa-10-phosphaphenanthrene=10-oxide; and derivatives obtained by reacting the cyclic organic phosphorus compound with a compound such as epoxy resin or phenol resin.

The amount is appropriately selected according to the kind of the phosphorous-based flame retardant, other components of the epoxy resin composition and the degree of desired flame retardancy. When red phosphorus is used as the non-halogen flame retardant in 100 parts by mass of an epoxy resin composition containing an epoxy resin, a curing agent, a non-halogen flame retardant and other fillers and additives, the amount is preferably within a range from 0.1 to 2.0 parts by mass. When an organic phosphorous compound is used, the amount is preferably within a range from 0.1 to 10.0 parts by mass, and particularly preferably from 0.5 to 6.0 parts by mass.

When the phosphorous-based flame retardant is used, the phosphorous-based flame retardant may be used in combination with hydrotalcite, magnesium hydroxide, boron compound, zirconium oxide, black dye, calcium carbonate, zeolite, zinc molybdate and activated carbon.

Examples of the nitrogen-based flame retardant include triazine compound, cyanuric acid compound, isocyanuric acid compound and phenothiazine, and a triazine compound, a cyanuric acid compound and an isocyanuric acid compound are preferable.

Examples of the triazine compound include, in addition to melamine, acetoguanamine, benzoguanamine, melon, melam, succinoguanamine, ethylenedimelamine, melamine polyphosphate and triguanamine, (i) aminotriazine sulfate compound such as guanylmelamine sulfate, melem sulfate or melam sulfate, (ii) cocondensate of phenols such as phenol, cresol, xylenol, butylphenol and nonylphenol, melamines such as melamine, benzoguanamin, acetoguanamine and formguanamine, and formaldehyde, (iii) mixture of the cocondensate (ii) and phenol resins such as phenolformaldehyde condensate, and (iv) those obtained by modifying the cocondensate (ii) and the mixture (iii) with tung oil or isomerized linseed oil.

Specific examples of the cyanuric acid compound include cyanuric acid and melamine cyanurate.

The amount of the nitrogen-based flame retardant is appropriately selected according to the kind of the nitrogen-based flame retardant, other components of the epoxy resin composition and the degree of desired flame retardancy, and is preferably within a range from 0.05 to 10 parts by mass, and particularly preferably from 0.1 to 5 parts by mass, based on 100 parts by mass of an epoxy resin composition containing an epoxy resin, a curing agent, a non-halogen flame retardant and other fillers and additives.

When the nitrogen-based flame retardant is used, a metal hydroxide and a molybdenum compound may be used in combination.

The silicone-based flame retardant is not specifically limited as far as it is an organic compound having a silicon atom, and examples thereof include silicone oil, silicone rubber and silicone resin.

The amount of the silicone-based flame retardant is appropriately selected according to the kind of the silicone-based flame retardant, other components of the epoxy resin composition and the degree of desired flame retardancy, and is preferably within a range from 0.05 to 20 parts by mass based on 100 parts by mass of an epoxy resin composition containing an epoxy resin, a curing agent, a non-halogen flame retardant and other fillers and additives. When the silicone-based flame retardant is used, a molybdenum compound and alumina may be used in combination.

Examples of the inorganic-based flame retardant include metal hydroxide, metal oxide, metal carbonate compound, metal powder, boron compound and low melting point glass.

Specific examples of the metal hydroxide include aluminum hydroxide, magnesium hydroxide, dolomite, hydrotalcite, calcium hydroxide, barium hydroxide and zirconium hydroxide.

Specific examples of the metal oxide include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide and tungsten oxide.

Specific examples of the metal carbonate compound include zinc carbonate, magnesium carbonate, calcium carbonate, barium carbonate, basic magnesium carbonate, aluminum carbonate, iron carbonate, cobalt carbonate and titanium carbonate.

Specific examples of the metal powder include aluminum, iron, titanium, manganese, zinc, molybdenum, cobalt, bismuth, chromium, nickel, copper, tungsten and tin powders.

Specific examples of the boron compound include zinc borate, zinc metaborate, barium metaborate, boric acid and borax.

Specific examples of the low melting point glass include Seaplea (Bokusui Brown Co Ltd.), hydrated glass $SiO_2$—$MgO$—$H_2O$, $PbO$—$B_2O_3$-based, $ZnO$—$P_2O_5$—$MgO$-based, $P_2O_5$—$B_2O_3$—$PbO$—$MgO$-based, $P$—$Sn$—$O$—$F$-based, $PbO$—$V_2O_5$—$TeO_2$-based, $Al_2O_3$—$H_2O$-based and lead borosilicate-based glassy compounds.

The amount of the inorganic-based flame retardant is appropriately selected according to the kind of the inorganic-based flame retardant, other components of the epoxy resin composition and the degree of desired flame retardancy, and is preferably within a range from 0.05 to 20 parts by mass, and particularly preferably from 0.5 to 15 parts by mass, based on 100 parts by mass of an epoxy resin composition containing an epoxy resin, a curing agent, a non-halogen flame retardant and other fillers and additives.

Examples of the organic metal salt-based flame retardant include ferrocene, acetylacetonate metal complex, organic metal carbonyl compound, organic cobalt salt compound, organic sulfonic acid metal salt, and compound obtained by ionic bonding or coordinate bonding of a metal atom and an aromatic compound or a heterocyclic compound.

The amount of the organic metal salt-based flame retardant is appropriately selected according to the kind of the organic metal salt-based flame retardant, other components of the epoxy resin composition and the degree of desired flame retardancy, and is preferably within a range from 0.005 to 10 parts by mass based on 100 parts by mass of an epoxy resin composition containing an epoxy resin, a curing agent, a non-halogen flame retardant and other fillers and additives.

If necessary, the epoxy resin composition of the present invention can contain inorganic fillers. Examples of the inorganic filler include fused silica, crystalline silica, alumina, silicon nitride and aluminum hydroxide. When the amount of the inorganic filler is particularly large, fused silica is preferably used. The fused silica can be used in a crushed or spherical form, and the spherical form is preferably used so as to increase the amount of the fused silica and to suppress an increase in melt viscosity of a molding material. To further increase the amount of the spherical silica, it is preferred to appropriately adjust particle size distribution of the spherical silica. Taking account of flame retardancy, the content of the filler is preferably high and is particularly preferably 65% by mass or more based on the total amount of the epoxy resin composition. When used in the conductive paste, a conductive filler such as silver powder or copper powder can be used.

To epoxy resin composition (I) or (II) of the present invention, various additives such as silane coupling agent, releasant, pigment and emulsifier can be added, if necessary.

Epoxy resin composition (I) or (II) of the present invention can be obtained by uniformly mixing the above-described components. The epoxy resin composition of the present invention, which contains an epoxy resin of the present invention, a curing agent and, if necessary, a curing accelerator, can be easily formed into a cured article by way of the common methods. Examples of the cured article include molded cured articles such as laminate, cast article, adhesive layer, coating film and film.

Examples of uses of the epoxy resin composition of the present invention include semiconductor encapsulation materials, resin compositions used for laminates and electronic circuit boards, resin casting materials, adhesives, interlayer insulation materials for buildup substrates, and coating materials such as insulating paint. The epoxy resin composition of the present invention can be preferably used as semiconductor encapsulation materials.

The epoxy resin composition for semiconductor encapsulation material is obtained by the following procedure. That is, an epoxy resin and compounding agents such as curing agent and filler are sufficiently mixed using an extruder, a kneader or a roll to obtain a uniform melt-mixing type epoxy resin composition. In that case, silica is usually used as the filler and the amount of the filler is preferably within a range from 30 to 95 parts by mass based on 100 parts by mass of the epoxy resin composition. To improve flame retardancy, moisture resistance and solder cracking resistance and to decrease the linear expansion coefficient, the amount of the filler is particularly preferably 70 parts by mass or more. To noticeably enhance the effect, the amount of the filler is adjusted to 80 parts by mass or more. In case of semiconductor package molding, the composition is molded by casting or using a transfer molding machine or an injection molding machine and then heated at 50 to 200° C. for 2 to 10 hours to obtain a semiconductor device as a molded article.

The epoxy resin composition of the present invention can be formed into a composition for printed circuit board, for example, a resin composition for prepreg. According to the viscosity, the epoxy resin composition can be used without using a solvent, and the resin composition for prepreg is preferably prepared by forming into a varnish using an organic solvent. As the organic solvent, a polar solvent having a boiling point of 160° C. or lower such as methyl ethyl ketone, acetone or dimethyl formamide is preferably used, and these organic solvents can be used alone or in combination. A prepreg as a cured article can be obtained by impregnating various reinforcing base materials such as paper, glass cloth, glass nonwoven fabric, aramid paper, aramid cloth, glass mat and glass roving cloth with the resulting varnish and by heating at a temperature corresponding to the kind of the solvent, preferably 50 to 170° C. The contents of the resin composition and the reinforcing base material are not specifically limited, and the content of the resin in the prepreg is preferably adjusted within a range from 20 to 60% by mass. When a copper-cladded laminate is produced using the epoxy resin composition, the copper-cladded laminate can be obtained by laying the resulting prepregs one upon another using a conventional method and appropriately laying a copper foil thereon, followed by press-contacting with heating at 170 to 250° C. under pressure of 1 to 10 MPa for 10 minutes to 3 hours.

When the epoxy resin composition of the present invention is used as a resist ink, for example, a cationic polymerization catalyst is used as a curing agent of epoxy resin composition (II) and a pigment, talc and a filler are added to give a composition for resist ink, and then the composition is coated onto a printed board using a screen printing method to give a resist ink cured article.

When the epoxy resin composition of the present invention is used as a conductive paste, for example, a method wherein conductive fine particles are dispersed in the epoxy resin composition to give a composition for anisotropic conductive layer; or a method wherein the composition is parepared into a paste resin composition for connection of circuits, which is liquid at room temperature, or an anisotropic conductive adhesive can be adopted.

An interlayer insulation material for buildup substrate can be obtained from the epoxy resin composition of the present invention in the following manner. That is, the curable resin composition obtained by appropriately mixing a rubber, a filler or the like is coated onto a wiring board having an inner layer circuit formed thereon using a spray coating method or a curtain coating method, and then cured. If necessary, predetermined holes such as throughholes are formed and the wiring board is treated with a roughening agent. The surface is washed with hot water to form irregularity and the wiring board is plated with metal such as copper. The plating method is preferably electroless plating or electroplating treatment, and examples of the roughening agent include oxidizing agent, alkali and organic solvent. Such an operation is optionally repeated successively, and a buldup substrate can be formed by way of alternating layers of a resin insulating layer and a conductive layer having a predetermined circuit pattern. Throughholes are formed after forming the outermost resin insulating layer. It is also possible to produce a buildup substrate without conducting the step of forming a roughened surface and a plating step by contact-bonding a copper foil coated with a semicured resin composition on a wiring board having an inner layer circuit formed thereon with heating at 170 to 250° C.

The cured article of the present invention may be obtained by a conventional method of curing an epoxy resin composition. For example, heating temperature conditions may be appropriately selected by the kind of curing agents to be used in combination and purposes, and the composition obtained by the above method may be heated at a temperature within a range from room temperature to about 250° C. The epoxy resin composition may be molded by a conventional method and the conditions peculiar to the epoxy resin composition of the present invention are not required.

Therefore, an environmentally friendly epoxy resin material capable of exhibiting excellent flame retardancy can be obtained by using the phenol resin even if a halogen-based flame retardant is not used. Excellent dielectric characteristics can realize an increase in operation speed of a high-frequency device and enable molecular design corresponding to the level of the above-described objective performances. The phenol resin can be produced by the method for producing of the present invention easily and effectively.

EXAMPLES

The present invention will now be described in detail by way of examples and comparative examples. In the following examples and comparative examples, parts and percentages are by mass unless otherwise specified. Melt viscosity at 150° C., GPC, NMR and MS spectrum were measured under the following conditions.
1) Melt viscosity at 150° C.: in accordance with ASTM D4287
2) Method for measurement of softening point: JIS K7234
3) GPC:
   Apparatus: HLC-8220 GPC manufactured by Tosoh Corporation
   Column: TSK-GEL G2000HXL+G2000HXL+G3000HXL+G4000HXL manufactured by Tosoh Corporation
   Solvent: tetrahydrofuran
   Flow rate: 1 ml/min
   Detector: RI
4) NMR: NMR GSX270 manufactured by JEOL Ltd.
5) MS: Double-focusing mass spectrometer AX505H (FD505H) manufactured by JEOL Ltd.

In the examples and comparative examples, "P-X-B", "E-X-B" and "B-X-B" mean a structure of a compound including the following structural units wherein P is a structural unit of a phenolic hydroxyl group-containing aromatic hydrocarbon group (P), E is a structural unit of a glycidyloxy group-containing aromatic hydrocarbon group (E), B is an alkoxy group-containing condensed polycyclic aromatic hydrocarbon group (B), and X is a structural unit of a divalent hydrocarbon group (X) selected from methylene, an alkylidene group and an aromatic hydrocarbon structure-containing methylene group.

Example 1

Synthesis of Phenol Resin (A-1)

In a flask equipped with a thermometer, a condenser tube, a distilling tube, a nitrogen introducing tube and a stirrer, 432.4 g (4.00 mols) of o-cresol, 158.2 g (1.00 mols) of 2-methoxynaphthalene and 179.3 g (2.45 mols) of 41% paraformaldehyde were charged, mixed with 9.0 g of oxalic acid and then reacted at 100° C. for 3 hours by heating to 100° C. While collecting water using a distilling tube, 73.2 g (1.00 mols) of 41% paraform was added dropwise over one hour. After the completion of dropwise addition, the reaction was conducted at 150° C. for 2 hours by heating to 150° C. over one hour. After the completion of the reaction, 1500 g of methyl isobutyl ketone was further added and the reaction solution was transferred to a separatory funnel, followed by washing with water. After washing with water until rinse water shows neutrality, unreacted o-cresol, 2-methoxynaphthalene and methyl isobutyl ketone were removed from the organic layer with heating under reduced pressure to obtain 531 g of a phenol resin (A-1) having a structural unit represented by the following structural formula:

[Chemical Formula 26]

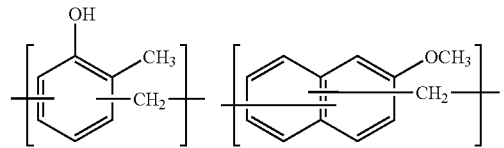

The resulting phenol resin had a softening point of 76° C. (B&R method), a melt viscosity (measuring method: ICI viscometer method, measured temperature: 150° C.) of 1.0 dPa·s and a hydroxyl group equivalent of 164 g/eq.

Figure 2:
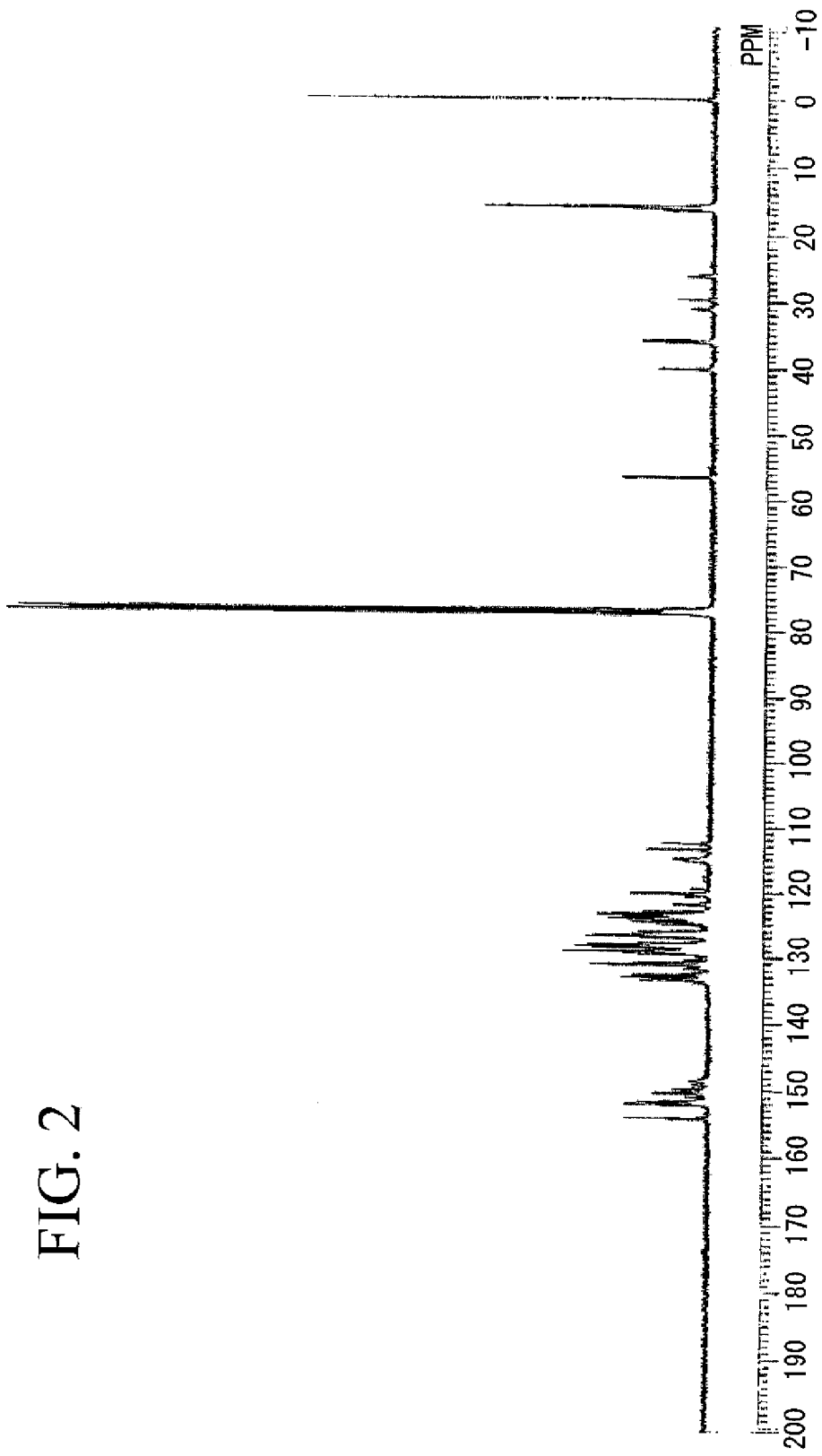
FIG. 2 is a graph showing a $^{13}$C-NMR spectrum of a phenol resin obtained in Example 1.
Figure 3:
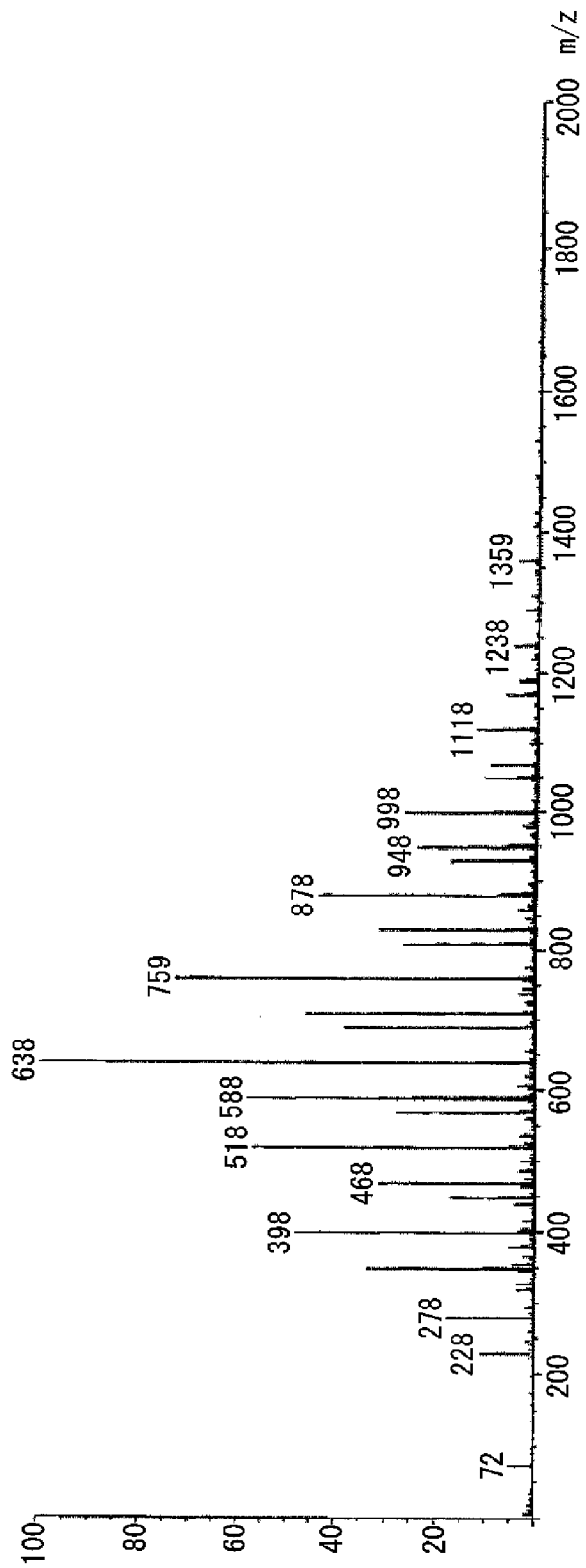
FIG. 3 is a graph showing a mass spectrum of a phenol resin obtained in Example 1.

A GPC chart of the resulting phenol resin is shown in FIG. 1, a $C^{13}$ NMR chart is shown in FIG. 2 and an MS spectrum is shown in FIG. 3. GPC analysis revealed that the content of a compound having a structure represented by "P-X-B" was 11% by mass and the content of a compound having a structure represented by "B-X-B" was 1% by mass. As a result of the measurement of the mass of the recovered unreacted o-cresol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 79/21. The remaining of methoxy group was confirmed from a signal of a methoxy group observed at 55 ppm in NMR and it is confirmed from a hydroxyl group equivalent that the methoxy group in the compound is not decomposed. Also it could be confirmed that the resulting resin has a structure represented by "B-X-" at the molecular end.

Example 2

Synthesis of Phenol Resin (A-2)

In a flask equipped with a thermometer, a condenser tube, a distilling tube, and a stirrer, 169.4 g (1.80 mols) of phenol, 31.6 g (0.20 mols) of 2-methoxynaphthalene and 32.6 g (1.00 mols) of 92% paraformaldehyde were charged, mixed with 5.0 g of oxalic acid, reacted at 100° C. for one hour by heating to 100° C. over one hour, and then reacted at 140° C. for one hour. After the completion of the reaction, 700 g of methyl isobutyl ketone was further added and the reaction solution was transferred to a separatory funnel, followed by washing with water. After washing with water until rinse water shows neutrality, unreacted phenol, 2-methoxynaphthalene and methyl isobutyl ketone were removed from the organic layer with heating under reduced pressure to obtain 149 g of a phenol resin (A-2) having a structural unit represented by the following structural formula:

[Chemical Formula 27]

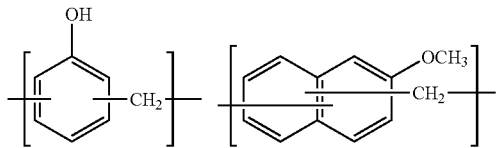

The resulting phenol resin had a softening point of 78° C. (B&R method), a melt viscosity (measuring method: ICI viscometer method, measured temperature: 150° C.) of 1.2 dPa·s and a hydroxyl group equivalent of 122 g/eq.

Figure 4:
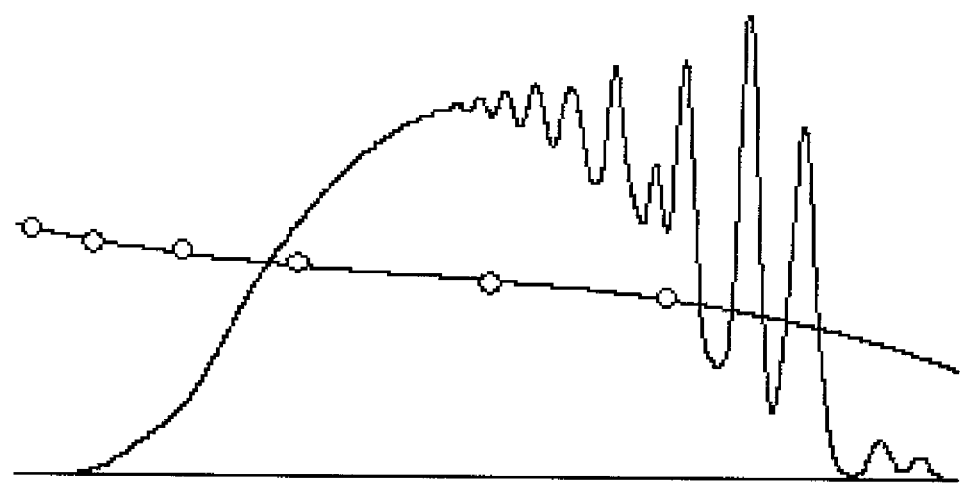
FIG. 4 is a graph showing a GPC chart of a phenol resin obtained in Example 2.
Figure 5:
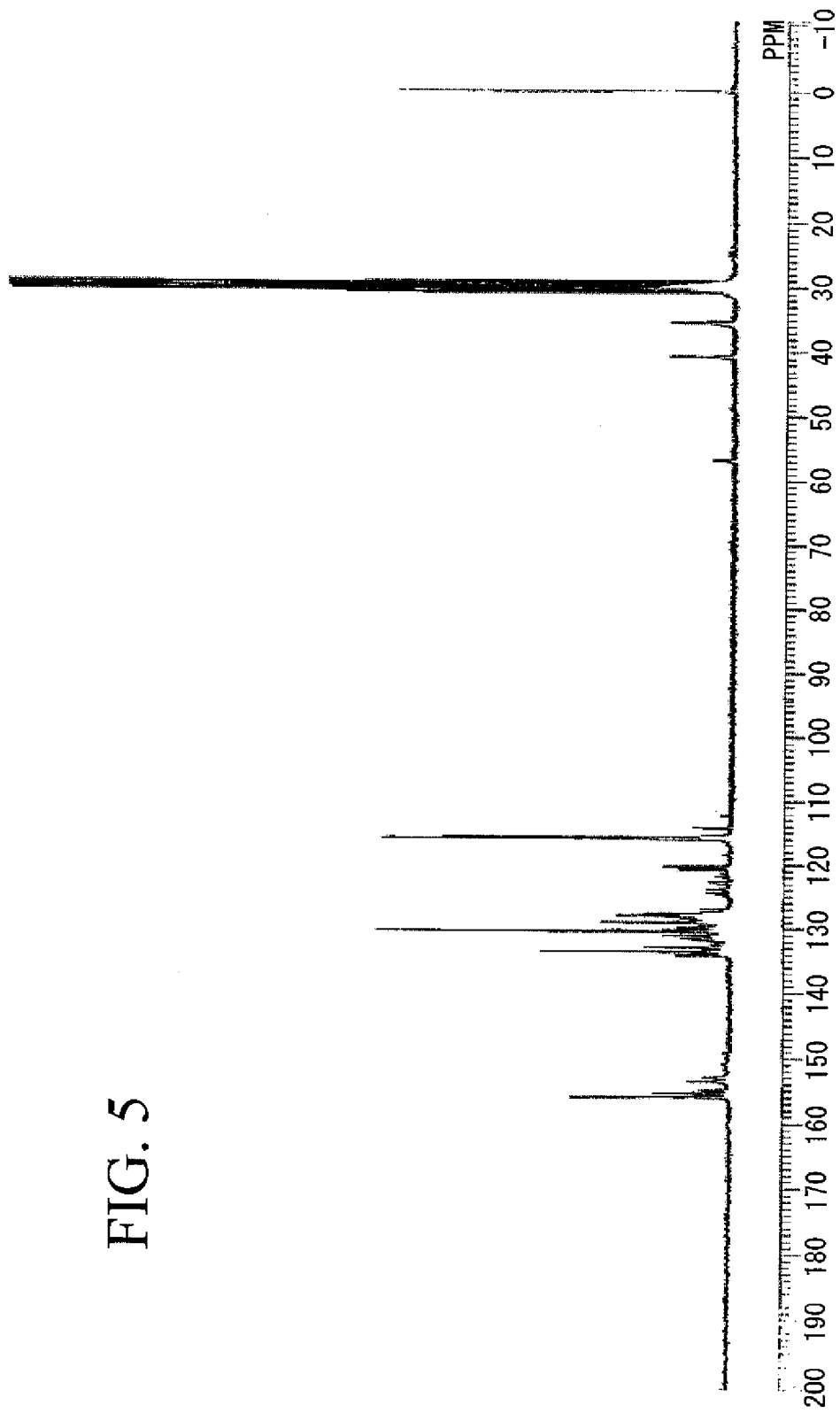
FIG. 5 is a graph showing a $^{13}$C-NMR spectrum of a phenol resin obtained in Example 2.
Figure 6:
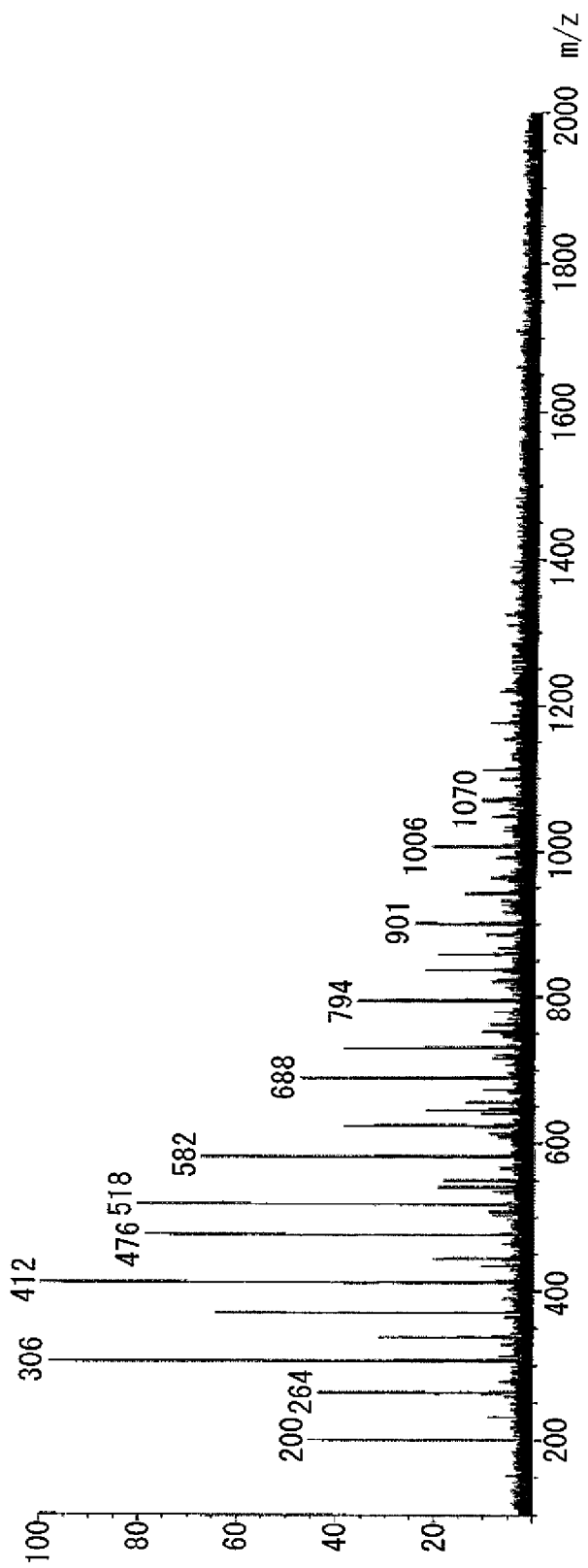
FIG. 6 is a graph showing a mass spectrum of a phenol resin obtained in Example 2.

A GPC chart of the resulting phenol resin is shown in FIG. 4, a C$^{13}$ NMR chart is shown in FIG. 5 and an MS spectrum is shown in FIG. 6. GPC analysis revealed that the content of a compound having a structure represented by "P-X-B" was 7% by mass and the content of a compound having a structure represented by "B-X-B" was trace. As a result of the measurement of the mass of the recovered unreacted phenol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 85/15. It was confirmed from a signal of a methoxy group observed at 55 ppm in NMR and a hydroxyl group equivalent that the methoxy group in the compound is not decomposed. Also it could be confirmed that the resulting resin has a structure represented by "B-X-" at the molecular end.

Example 3

Synthesis of Phenol Resin (A-3)

In a flask equipped with a thermometer, a condenser tube, a distilling tube, and a stirrer, 141.2 g (1.50 mols) of phenol, 79.1 g (0.50 mols) of 2-methoxynaphthalene and 32.6 g (1.00 mols) of 92% paraformaldehyde were charged, mixed with 5.0 g of oxalic acid, reacted at 100° C. for 2 hours by heating to 100° C. over one hour. After the completion of the reaction, 700 g of methyl isobutyl ketone was further added and the reaction solution was transferred to a separatory funnel, followed by washing with water. After washing with water until rinse water shows neutrality, unreacted phenol, 2-methoxynaphthalene and methyl isobutyl ketone were removed from the organic layer with heating under reduced pressure to obtain 174 g of a phenol resin (A-3) having a structural unit represented by the following structural formula:

[Chemical Formula 28]

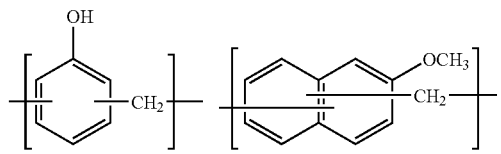

The resulting phenol resin had a softening point of 74° C. (B&R method), a melt viscosity (measuring method: ICI viscometer method, measured temperature: 150° C.) of 1.0 dPa·s and a hydroxyl group equivalent of 200 g/eq.

Figure 7:
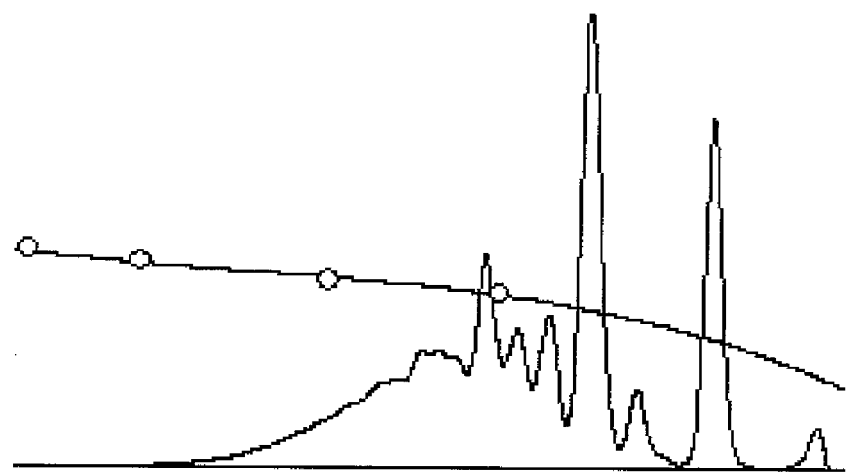
FIG. 7 is a graph showing a GPC chart of a phenol resin obtained in Example 3.

A GPC chart of the resulting phenol resin is shown in FIG. 7. GPC analysis revealed that the content of a compound having a structure represented by "P-X-B" was 22% by mass and the content of a compound having a structure represented by "B-X-B" was 4% by mass. As a result of the measurement of the mass of the recovered unreacted phenol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 65/35. Also it could be confirmed that the resulting resin has a structure represented by "B-X-" at the molecular end.

Example 4

Synthesis of Phenol Resin (A-4)

In a flask equipped with a thermometer, a condenser tube, a distilling tube, a nitrogen introducing tube and a stirrer, 432.4 g (4.00 mols) of o-cresol, 158.2 g (1.00 mols) of 2-methoxynaphthalene and 212.2 g (2.00 mols) of benzaldehyde were charged, mixed with 9.0 g of paratoluenesulfonic acid, reacted at 145° C. for 5 hours by heating to 145° C. over one hour. While collecting water using a distilling tube, the reaction was conducted at 170° C. for 2 hours by heating to 170° C. over one hour. After the completion of the reaction, 1500 g of methyl isobutyl ketone was further added and the reaction solution was transferred to a separatory funnel, followed by washing with water. After washing with water until rinse water shows neutrality, unreacted o-cresol, 2-methoxynaphthalene and methyl isobutyl ketone were removed from the organic layer with heating under reduced pressure to obtain 545 g of a phenol resin (A-4) having a structural unit represented by the following structural formula:

[Chemical Formula 29]

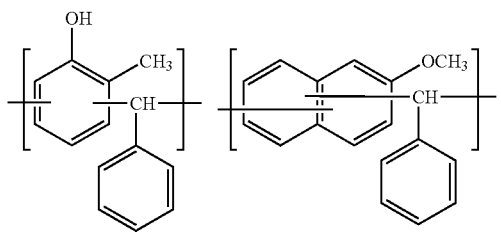

The resulting phenol resin had a softening point of 99° C. (B&R method), a melt viscosity (measuring method: ICI viscometer method, measured temperature: 150° C.) of 5.0 dPa·s and a hydroxyl group equivalent of 219 g/eq.

Figure 8:
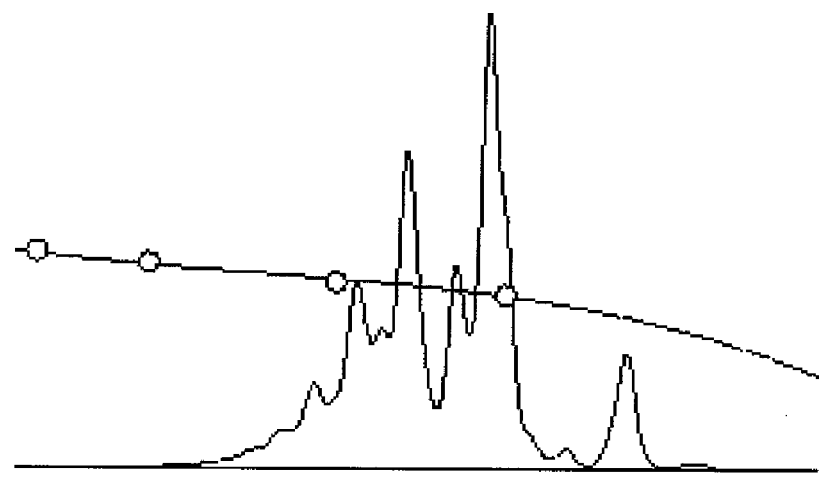
FIG. 8 is a graph showing a GPC chart of a phenol resin obtained in Example 4.

A GPC chart of the resulting phenol resin is shown in FIG. 8. GPC analysis revealed that the content of a compound having a structure represented by "P-X-B" was 12% by mass and the content of a compound having a structure represented by "B-X-B" was 1% by mass. As a result of the measurement of the mass of the recovered unreacted o-cresol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 80/20. Also it could be confirmed that the resulting resin has a structure represented by "B-X-" at the molecular end.

Example 5

Synthesis of Phenol Resin (A-5)

In the same manner as in Example 3, except that 173.0 g (1.60 mols) of phenol and 63.3 g (0.40 mols) of 2-methoxynaphthalene were used, 177 g of a phenol resin (A-5) having a structural unit represented by the following structural formula:

[Chemical Formula 30]

Figure 9:
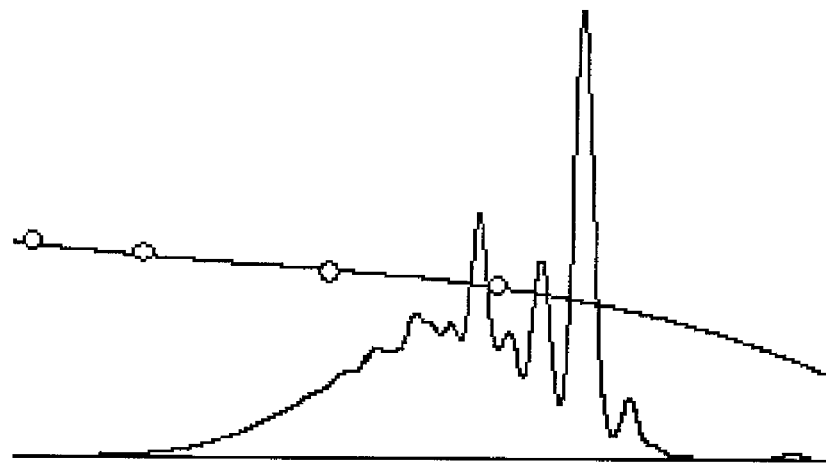
FIG. 9 is a graph showing a GPC chart of a phenol resin obtained in Example 5.

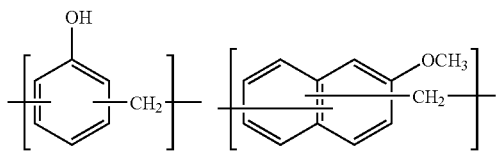

was obtained. The resulting phenol resin had a softening point of 67° C. (B&R method), a melt viscosity (measuring method: ICI viscometer method, measured temperature: 150° C.) of 0.4 dPa·s and a hydroxyl group equivalent of 170 g/eq. A GPC chart of the resulting phenol resin is shown in FIG. 9. GPC analysis revealed that the content of a compound having a structure represented by "P-X-B" was 24% by mass and the content of a compound having a structure represented by "B-X-B" was 3% by mass. As a result of the measurement of the mass of the recovered unreacted phenol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 74/26. Also it could be confirmed that the resulting resin has a structure represented by "B-X-" at the molecular end.

Example 6

Synthesis of Phenol Resin (A-6)

In the same manner as in Example 3, except that 334.0 g (1.67 mols) of bisphenol F in place of the phenol in Example 3 and 131.3 g (0.83 mols) of 2-methoxynaphthalene were used, 350 g of a phenol resin (A-6) having a structural unit represented by the following structural formula:

[Chemical Formula 31]

Figure 10:
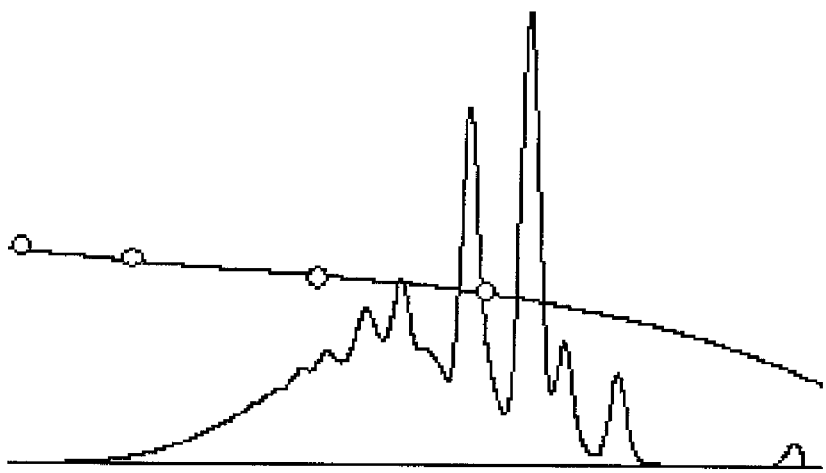
FIG. 10 is a graph showing a GPC chart of a phenol resin obtained in Example 6.

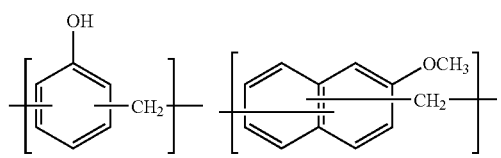

was obtained. The resulting phenol resin had a softening point of 64° C. (B&R method), a melt viscosity (measuring method: ICI viscometer method, measured temperature: 150° C.) of 0.5 dPa·s and a hydroxyl group equivalent of 139 g/eq. A GPC chart of the resulting phenol resin is shown in FIG. 10. GPC analysis revealed that the content of a compound having a structure represented by "P-X-B" was 0% by mass and the content of a compound having a structure represented by "B-X-B" was 4% by mass. As a result of the measurement of the mass of the recovered unreacted 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 85/15. Also it could be confirmed that the resulting resin has a structure represented by "B-X-" at the molecular end.

Example 7

Synthesis of Phenol Resin (A-7)

In a flask equipped with a thermometer, a condenser tube, a distilling tube, a nitrogen introducing tube and a stirrer, 376.4 g (4.00 mols) of phenol, 158.2 g (1.00 mols) of 2-methoxynaphthalene and 159.2 g (1.50 mols) of benzaldehyde were charged, mixed with 9.0 g of paratoluenesulfonic acid, reacted at 145° C. for 5 hours by heating to 145° C. over one hour. While collecting water using a distilling tube, the reaction was conducted at 170° C. for 2 hours by heating to 170° C. over one hour. After the completion of the reaction, 1500 g of methyl isobutyl ketone was further added and the reaction solution was transferred to a separatory funnel, followed by washing with water. After washing with water until rinse water shows neutrality, unreacted phenol, 2-methoxynaphthalene and methyl isobutyl ketone were removed from the organic layer with heating under reduced pressure to obtain a phenol resin (A-7) having a structural unit represented by the following structural formula:

[Chemical Formula 32]

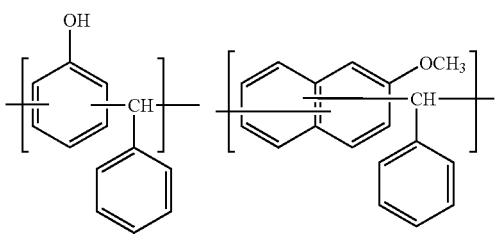

The resulting phenol resin had a softening point of 63° C. (B&R method), a melt viscosity (measuring method: ICI viscometer method, measured temperature: 150° C.) of 1.2 dPa·s and a hydroxyl group equivalent of 288 g/eq.

Figure 11:
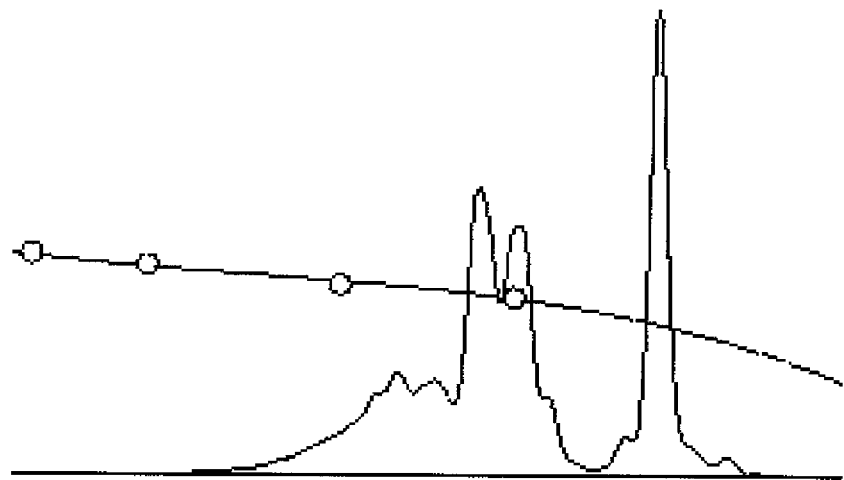
FIG. 11 is a graph showing a GPC chart of a phenol resin obtained in Example 7.

A GPC chart of the resulting phenol resin is shown in FIG. 11. As a result of the measurement of the mass of the recovered unreacted phenol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 80/20.

Example 8

Synthesis of Phenol Resin (A-8)

In the same manner as in Example 7, except that 182.2 g (1.00 mols) of 4-biphenylaldehyde was used in place of benzaldehyde in Example 7, a phenol resin (A-8) having a structural unit represented by the following structural formula:

[Chemical Formula 33]

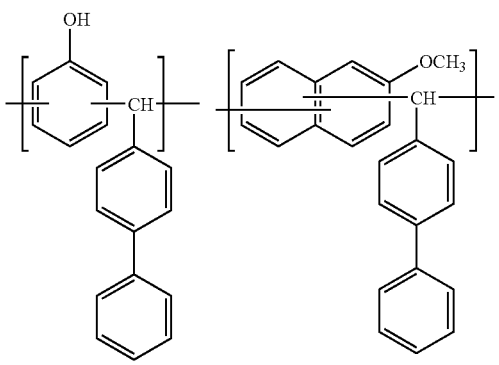

was obtained. The resulting phenol resin had a softening point of 61° C. (B&R method), a melt viscosity (measuring method: ICI viscometer method, measured temperature: 150° C.) of 1.1 dPa·s and a hydroxyl group equivalent of 323 g/eq.

Figure 12:
FIG. 12 is a graph showing a GPC chart of a phenol resin obtained in Example 8.

A GPC chart of the resulting phenol resin is shown in FIG. 12. As a result of the measurement of the mass of the recovered unreacted phenol and 2-methoxynaphthalene and the measurement of a hydroxyl group of the resulting phenol resin, it was confirmed that a molar ratio of a structural unit of a phenolic hydroxyl group-containing aromatic hydrocarbon group to a structural unit of an alkoxy group-containing condensed polycyclic aromatic hydrocarbon group in the phenol resin, the former/the latter, was 80/20.

Synthesis Example 1

Synthesis of compound of Japanese Unexamined Patent Application, First Publication No. 2004-010700

108.0 g (1.0 mols) of orthocresol and 132.0 g (2.2 mols) of an aqueous 50% formalin solution were charged in a reaction vessel and 133.3 g (1.0 mols) of an aqueous 30% sodium hydroxide solution was added dropwise over one hour while maintaining at 30° C. or lower. After the completion of the dropwise addition, the reaction was conducted for 2 hours by heating to 40° C. Then, 126.0 g (1.0 mols) of dimethyl sulfate was added dropwise at 40° C. over one hour and the reaction was conducted for 2 hours by heating to 60° C., thereby to synthesize a resol resin wherein a phenolic hydroxyl group is methoxylated. After the completion of the reaction, the aqueous layer was separated and 282.0 g (3.0 mols) of phenol and 9.1 g of 35% hydrochloric acid were added, followed by the reaction at 90° C. for 4 hours. After the completion of the reaction, the reaction solution was neutralized with 6.0 g of an aqueous 25% ammonia solution and a neutralized salt was removed by washing with water. The unreacted phenol was removed by heating to 200° C. under 60 mmHg to obtain a phenol resin (A-9). The resulting phenol resin had a softening point of 77° C. (B&R method), a melt viscosity (measuring method: ICI viscometer method, measured temperature: 150° C.) of 0.8 dPa·s and a hydroxyl group equivalent of 160 g/eq.

Synthesis Example 2

In a 500 ml four-necked flask, 144 g (1.0 mols) of 2-naphthol, 200 g of isopropyl alcohol and 8.2 g of 49% sodium hydroxide were charged and then heated to 40° C. in a nitrogen gas flow while stirring. After heating, the temperature was raised to 60° C. while adding dropwise 37 g (0.5 mols) of 41% formalin over 2 hours and then the reaction was conducted at 60° C. for 2 hours. As a result, a compound represented by the following structural formula:

[Chemical Formula 34]

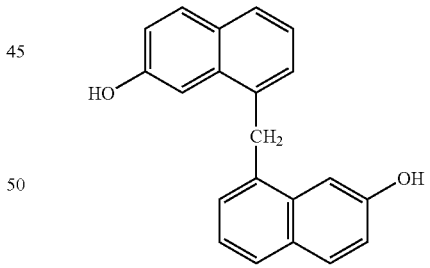

was obtained and a methylol compound was not obtained.

Example 9

Synthesis of Epoxy Resin (E-1)

In a flask equipped with a thermometer, a dropping funnel, a condenser tube and a stirrer, 164 g (hydroxyl group: 1 equivalent) of the phenol resin (A-1) obtained in Example 1, 463 g (5.0 mols) of epichlorohydrin, 139 g of n-butanol and 2 g of tetraethylbenzylammonium chloride were charged and dissolved while purging with a nitrogen gas. After heating to 65° C., the pressure was reduced to the pressure at which an azeotrope is produced, and then 90 g (1.1 mols) of an aqueous 49% sodium hydroxide solution was added dropwise over 5 hours. Under the same conditions, stirring was continued for 0.5 hours. The distillate produced by azeotropy during stirring was separated by a Dean-Stark trap and the aqueous layer was removed, and then the reaction was conducted while returning the oil layer into the reaction system. Then, the unreacted epichlorohydrin was distilled off by distillation under reduced pressure. The resulting crude epoxy resin was dissolved in 590 g of methyl isobutyl ketone and 177 g of n-butanol. To the solution, 10 g of an aqueous 10% sodium hydroxide solution was added. After reacting at 80° C. for 2 hours, the solution was repeatedly washed with 150 g of water three times until the pH of the wash becomes neutral. The system was dehydrated by azeotropy and, after precise filtration, the solvent was distilled off under reduced pressure to obtain 198 g of an epoxy resin (E-1) having a structural unit represented by the following structural formula.

[Chemical Formula 35]

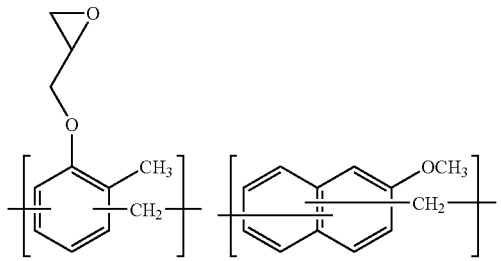

The resulting epoxy resin had a softening point of 58° C. (B&R method), a melt viscosity (measuring method: ICI viscometer method, measured temperature: 150° C.) of 1.0 dPa·s and an epoxy equivalent of 252 g/eq.

Figure 13:
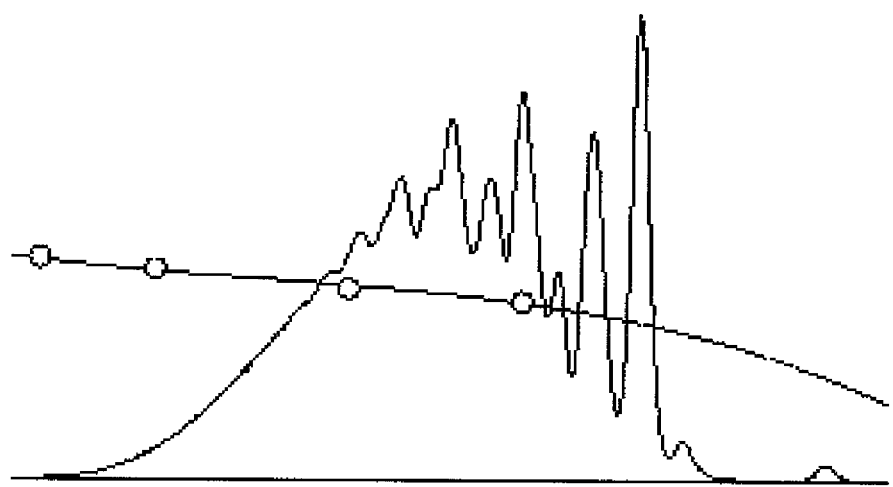
FIG. 13 is a graph showing a GPC chart of an epoxy resin obtained in Example 9.
Figure 14:
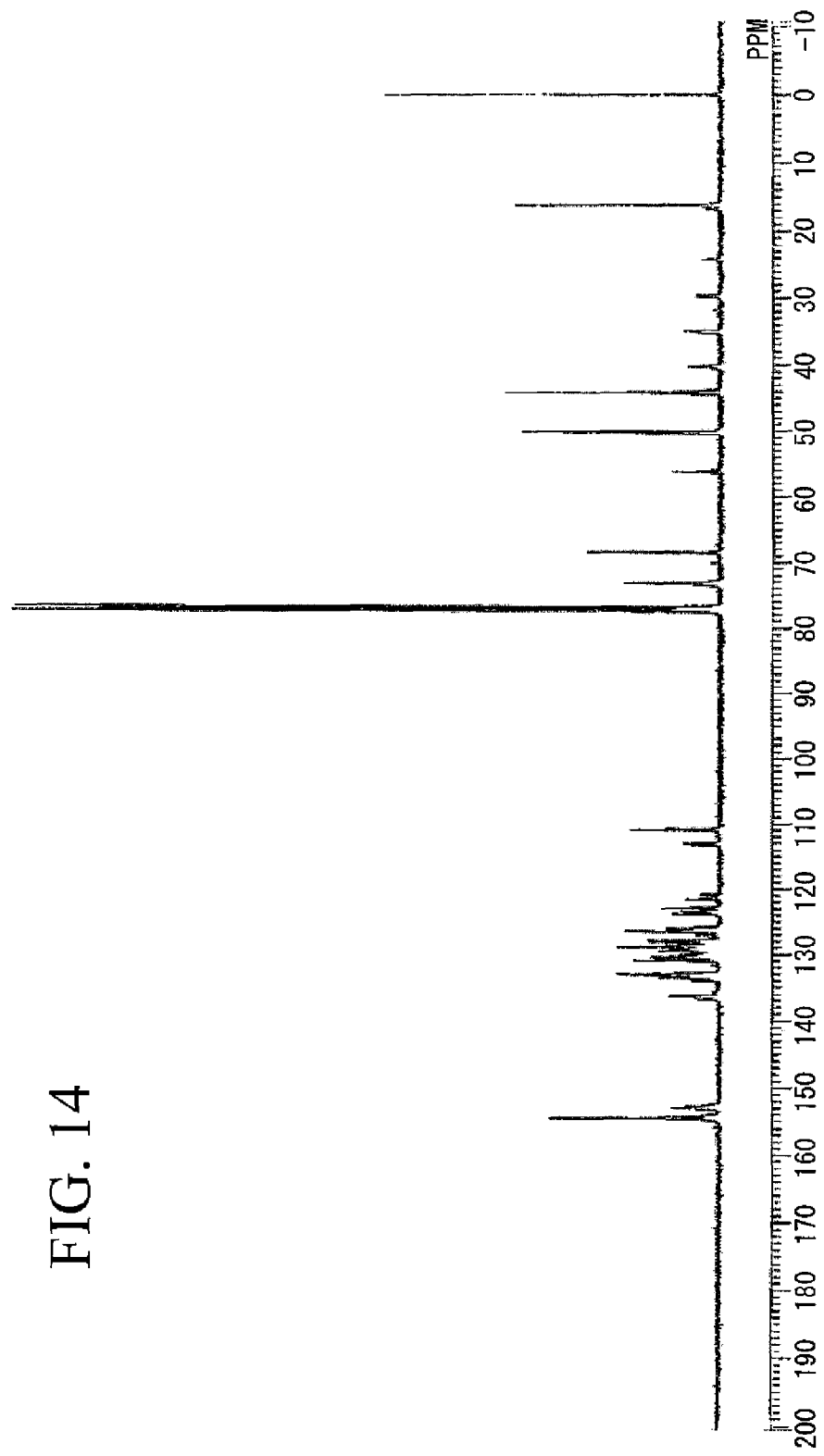
FIG. 14 is a graph showing a $^{13}$C-NMR spectrum of an epoxy resin obtained in Example 9.
Figure 15:
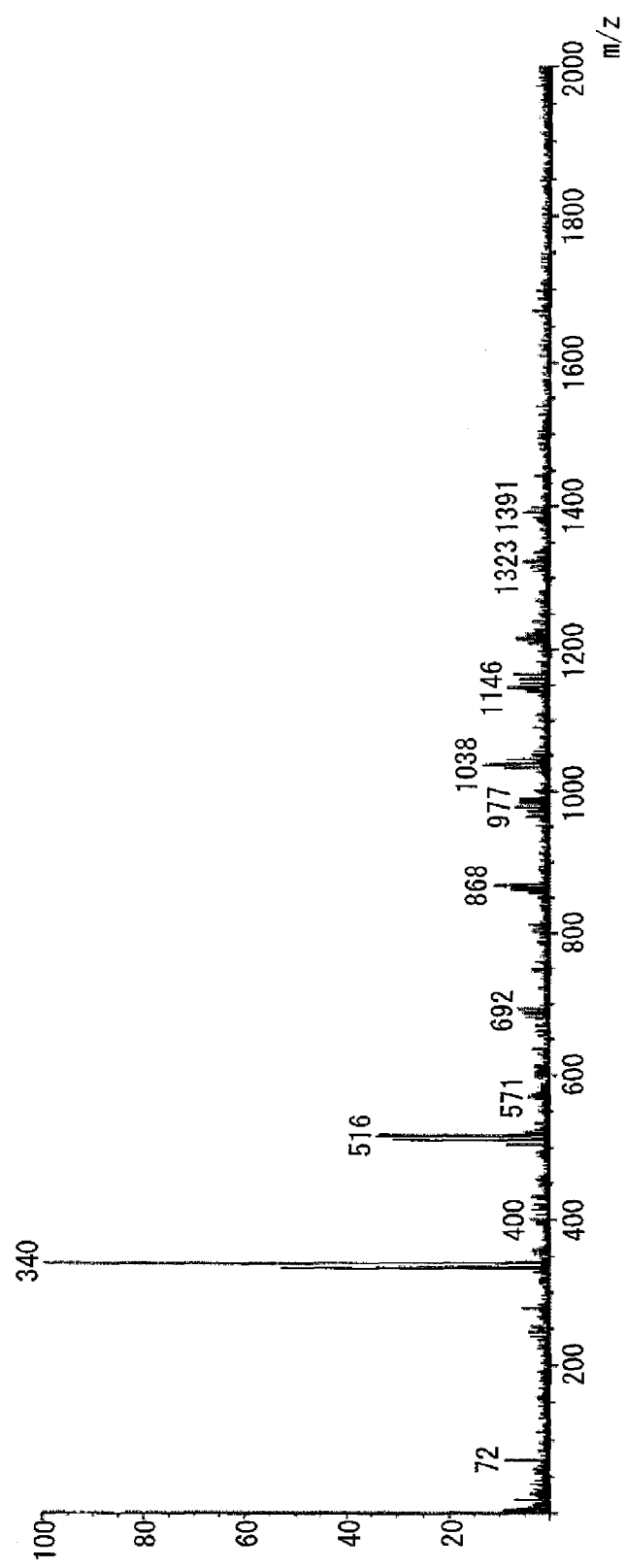
FIG. 15 is a graph showing a mass spectrum of an epoxy resin obtained in Example 9.

A GPC chart of the resulting epoxy resin is shown in FIG. 13, a $^{13}$C NMR chart is shown in FIG. 14 and an MS spectrum is shown in FIG. 15. GPC analysis revealed that the content of a compound having a structure represented by "E-X-B" was 10% by mass and the content of a compound having a structure represented by "B-X-B" was 1% by mass. It was confirmed the remaining of methoxy group from a signal of a methoxy group observed at 55 ppm in NMR and an epoxy equivalent that the methoxy group in the compound is not decomposed. A molar ratio of a structural unit of a glycidyloxy group-containing aromatic hydrocarbon group to a structural unit of an alkoxy group-containing condensed polycyclic aromatic hydrocarbon group in the epoxy resin was determined from the results of the measurement of the mass of the recovered unreacted o-cresol and 2-methoxynaphthalene in case of producing the phenol resin (A-1) and the measurement of a hydroxyl group of the resulting phenol resin. As a result, a ratio of the former/the latter was 79/21. Also it could be confirmed that the resulting resin has a structure represented by "B-X-" at the molecular end.

Example 10

Synthesis of Epoxy Resin (E-2)

In the same manner as in Example 9, except that the phenol resin (A-1) was replaced by 122 g (hydroxyl group: 1 equivalent) of the phenol resin (A-2) obtained in Example 2, 160 g of an epoxy resin (E-2) having a structural unit represented by the following structural formula:

[Chemical Formula 36]

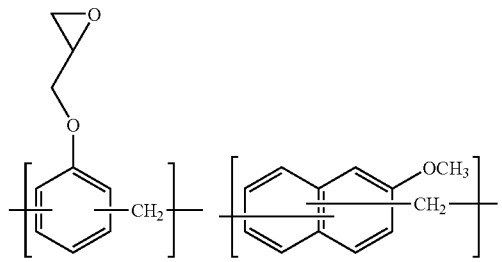

was obtained by epoxidation reaction.

The resulting epoxy resin had a softening point of 60° C. (B&R method), a melt viscosity (measuring method: ICI viscometer method, measured temperature: 150° C.) of 1.0 dPa·s and an epoxy equivalent of 200 g/eq.

Figure 16:
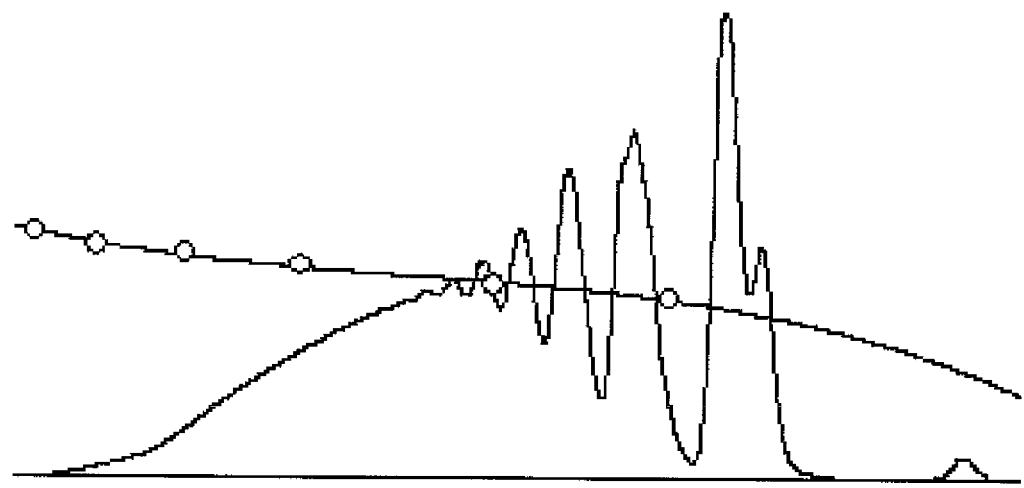
FIG. 16 is a graph showing a GPC chart of an epoxy resin obtained in Example 10.
Figure 17:
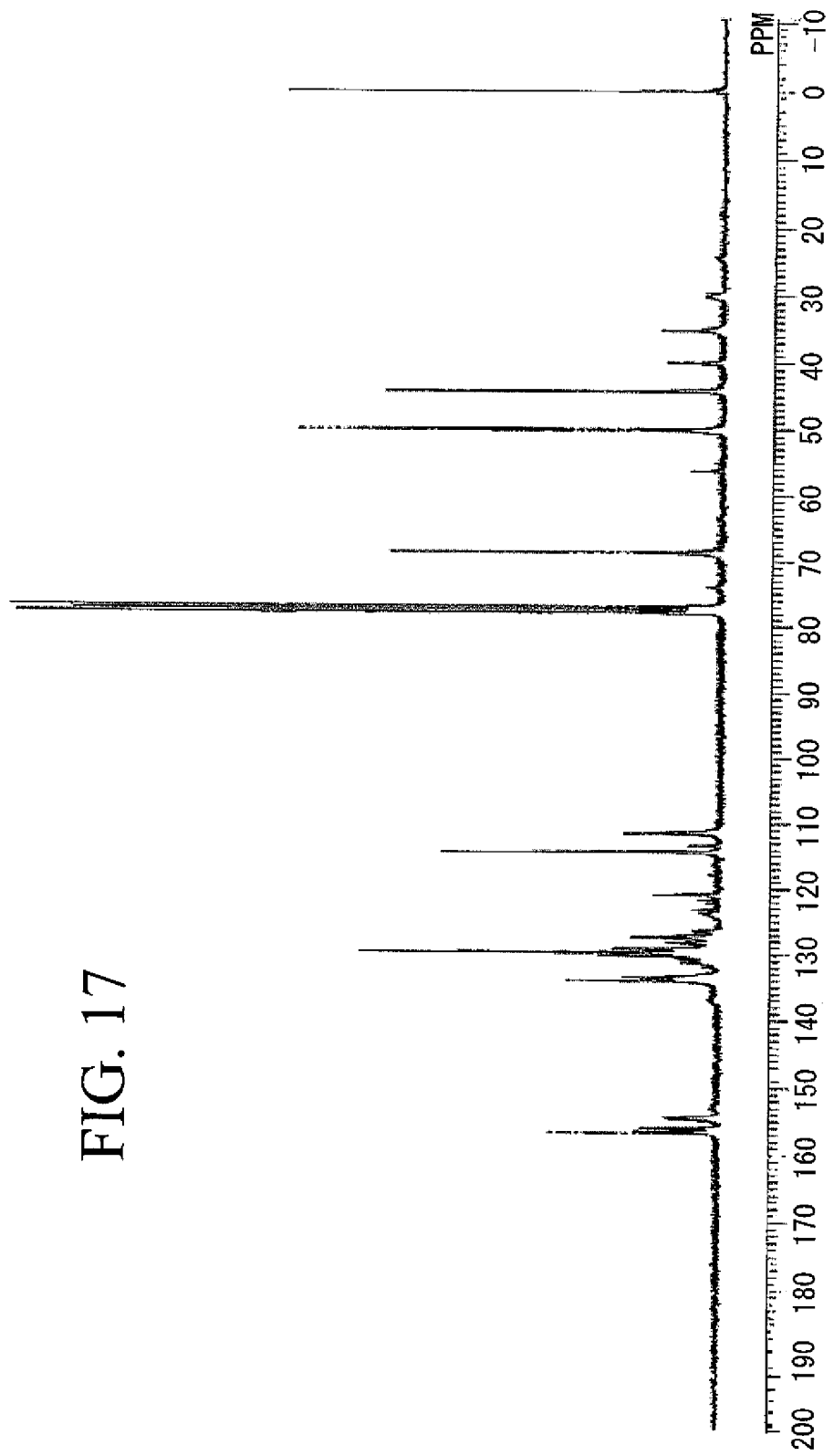
FIG. 17 is a graph showing a $^{13}$C-NMR spectrum of an epoxy resin obtained in Example 10.
Figure 18:
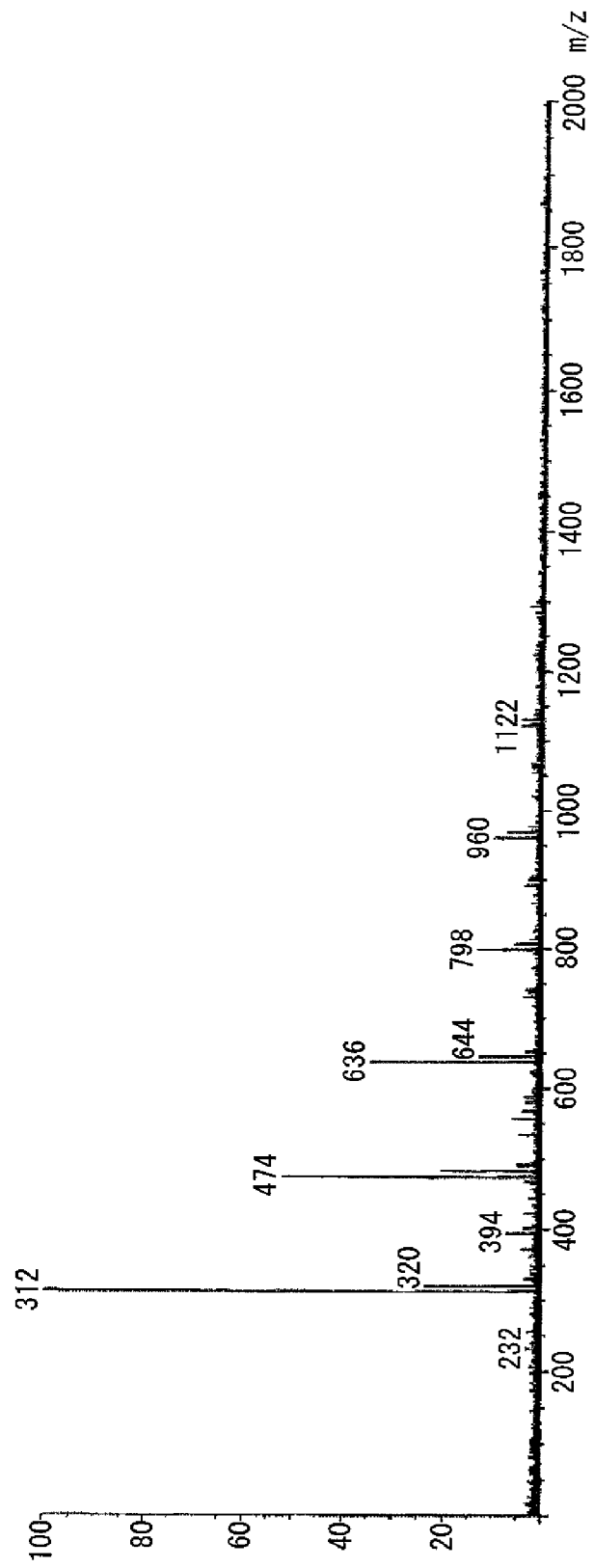
FIG. 18 is a graph showing a mass spectrum of an epoxy resin obtained in Example 10.

A GPC chart of the resulting epoxy resin is shown in FIG. 16, a $^{13}$C NMR chart is shown in FIG. 17 and an MS spectrum is shown in FIG. 18. GPC analysis revealed that the content of a compound having a structure represented by "E-X-B" was 6% by mass and the content of a compound having a structure represented by "B-X-B" was trace. It was confirmed the remaining of methoxy group from a signal of a methoxy group observed at 55 ppm in NMR and an epoxy equivalent that the methoxy group in the compound is not decomposed. A molar ratio of a structural unit of a glycidyloxy group-containing aromatic hydrocarbon group to a structural unit of an alkoxy group-containing condensed polycyclic aromatic hydrocarbon group in the epoxy resin was determined from the results of the measurement of the mass of the recovered unreacted phenol and 2-methoxynaphthalene in case of producing the phenol resin (A-2) and the measurement of a hydroxyl group of the resulting phenol resin. As a result, a ratio of the former/the latter was 92/8. Also it could be confirmed that the resulting resin has a structure represented by "B-X-" at the molecular end.

Example 11

Synthesis of Epoxy Resin (E-3)

In the same manner as in Example 9, except that the phenol resin (A-1) was replaced by 200 g (hydroxyl group: 1 equivalent) of the phenol resin (A-3) obtained in Example 3, 230 g of an epoxy resin (E-3) having a structural unit represented by the following structural formula:

[Chemical Formula 37]

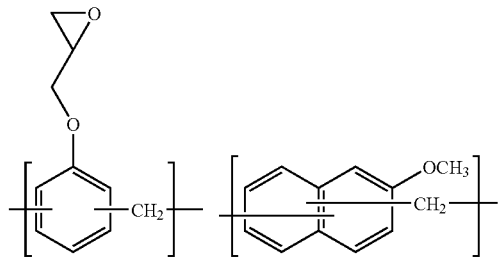

was obtained by epoxidation reaction. The resulting epoxy resin had a softening point of 55° C. (B&R method), a melt viscosity (measuring method: ICI viscometer method, measured temperature: 150° C.) of 0.8 dPa·s and an epoxy equivalent of 290 g/eq. A molar ratio of a structural unit of a glycidyloxy group-containing aromatic hydrocarbon group to a structural unit of an alkoxy group-containing condensed polycyclic aromatic hydrocarbon group in the epoxy resin was determined from the results of the measurement of the mass of the recovered unreacted phenol and 2-methoxynaphthalene in case of producing the phenol resin (A-3) and the measurement of a hydroxyl group of the resulting phenol resin. As a result, a ratio of the former/the latter was 65/35.

Example 12

Synthesis of Epoxy Resin (E-4)

In the same manner as in Example 9, except that the phenol resin (A-1) was replaced by 219 g (hydroxyl group: 1 equivalent) of the phenol resin (A-4) obtained in Example 4, 247 g of an epoxy resin (E-4) having a structural unit represented by the following structural formula:

[Chemical Formula 38]

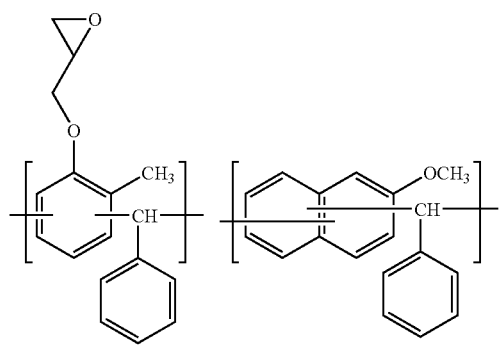

was obtained by epoxidation reaction. The resulting epoxy resin had a softening point of 78° C. (B&R method), a melt viscosity (measuring method: ICI viscometer method, measured temperature: 150° C.) of 2.0 dPa·s and an epoxy equivalent of 298 g/eq.

Figure 19:
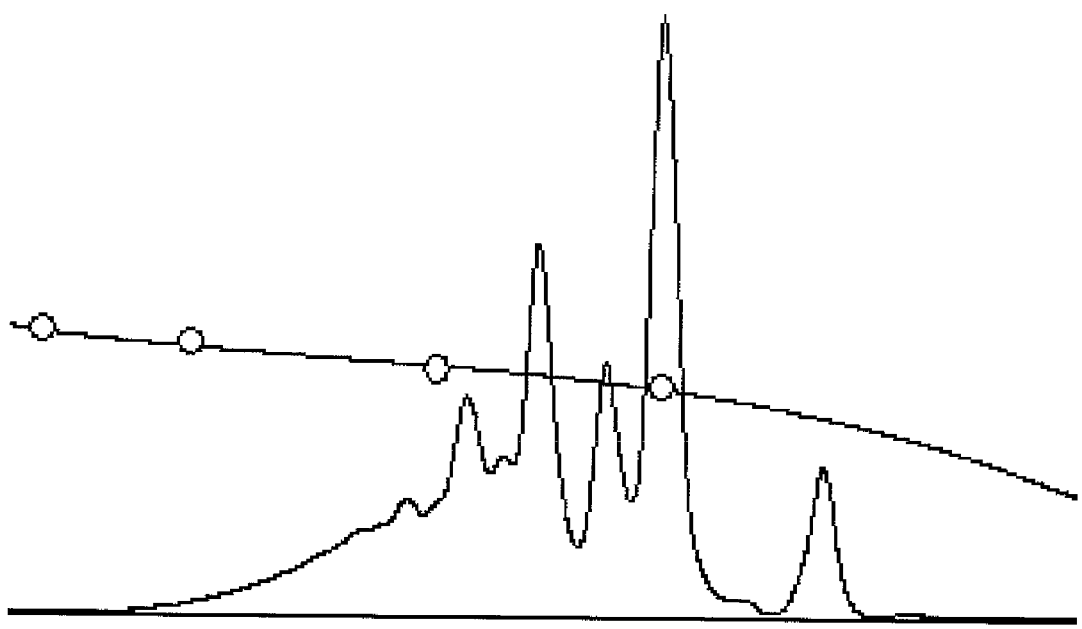
FIG. 19 is a graph showing a GPC chart of an epoxy resin obtained in Example 12.

A GPC chart of the resulting epoxy resin is shown in FIG. 19. GPC analysis revealed that the content of a compound having a structure represented by "E-X-B" was 11% by mass and the content of a compound having a structure represented by "B-X-B" was 1% by mass. A molar ratio of a structural unit of a glycidyloxy group-containing aromatic hydrocarbon group to a structural unit of an alkoxy group-containing condensed polycyclic aromatic hydrocarbon group in the epoxy resin was determined from the results of the measurement of the mass of the recovered unreacted o-cresol and 2-methoxynaphthalene in case of producing the phenol resin (A-4) and the measurement of a hydroxyl group of the resulting phenol resin. As a result, a ratio of the former/the latter was 80/20. Also it could be confirmed that the resulting resin has a structure represented by "B-X-" at the molecular end.

Synthesis Example 3

In a flask equipped with a thermometer, a dropping funnel, a condenser tube and a stirrer, 168 parts of Milex XLC-4L manufactured by Mitsui Chemicals Co., Ltd., 463 g (5.0 mols) of epichlorohydrin, 139 g of n-butanol and 2 g of tetraethylbenzylammonium chloride were charged and dissolved while purging with a nitrogen gas. After heating to 65° C., the pressure was reduced to the pressure at which an azeotrope is produced, and then 90 g (1.1 mols) of an aqueous 49% sodium hydroxide solution was added dropwise over 5 hours. Under the same conditions, stirring was continued for 0.5 hours. The distillate produced by azeotropy during stirring was separated by a Dean-Stark trap and the aqueous layer was removed, and then the reaction was conducted while returning the oil layer into the reaction system. Then, the unreacted epichlorohydrin was distilled off by distillation under reduced pressure. The resulting crude epoxy resin was dissolved in 590 g of methyl isobutyl ketone and 177 g of n-butanol. To the solution, 10 g of an aqueous 10% sodium hydroxide solution was added. After reacting at 80° C. for 2 hours, the solution was repeatedly washed with 150 g of water three times until the pH of the wash becomes neutral. The system was dehydrated by azeotropy and, after precise filtration, the solvent was distilled off under reduced pressure to obtain an epoxy resin (E-5) having a structural unit represented by the following structural formula.

[Chemical Formula 39]

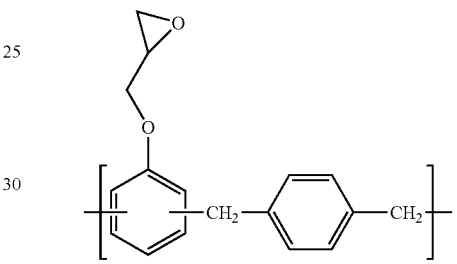

The resulting epoxy resin had an epoxy equivalent of 241 g/eq. Synthesis Example 4 (Synthesis of epoxy resin described in Japanese Unexamined Patent Application, First Publication No. 2003-201333)

In a 1 liter four-necked flask equipped with a stirrer and a heater, 152 g (1.0 mols) of trimethylhydroquinone was dissolved in a solvent mixture of 500 g of toluene and 200 g of ethylene glycol monoethyl ether. To the solution, 4.6 g of paratoluenesulfonic acid was added and 64 g (0.6 mols) of 41% benzaldehyde was added dropwise while paying attention to heat generation. While distilled off moisture, the solution was stirred at 100 to 120° C. for 15 hours. After cooling, the precipitated crystal was collected by filtration, repeatedly washed with water until the filtrate becomes neutral, and then dried to obtain 175 g of a phenol resin (GPC purity: 99%).

In a flask equipped with a thermometer, a dropping funnel, a condenser tube and a stirrer, 175 g of a phenol resin, 463 g (5.0 mols) of epichlorohydrin, 53 g of n-butanol and 2.3 g of tetraethylbenzylammonium chloride were charged and dissolved while purging with a nitrogen gas. After heating to 65° C., the pressure was reduced to the pressure at which an azeotrope is produced, and then 82 g (1.0 mols) of an aqueous 49% sodium hydroxide solution was added dropwise over 5 hours. Under the same conditions, stirring was continued for 0.5 hours.

The distillate produced by azeotropy during stirring was separated by a Dean-Stark trap and the aqueous layer was removed, and then the reaction was conducted while returning the oil layer into the reaction system. Then, the unreacted epichlorohydrin was distilled off by distillation under reduced pressure. The resulting crude epoxy resin was dissolved in 550 g of methyl isobutyl ketone and 55 g of n-butanol. To the solution, 15 g of an aqueous 10% sodium hydroxide solution was added. After reacting at 80° C. for 2 hours, the solution was repeatedly washed with 100 g of water three times until the pH of the wash becomes neutral. The system was dehydrated by azeotropy and, after precise filtration, the solvent was distilled off under reduced pressure to obtain an epoxy resin (E-6) represented by the following structural formula.

[Chemical Formula 40]

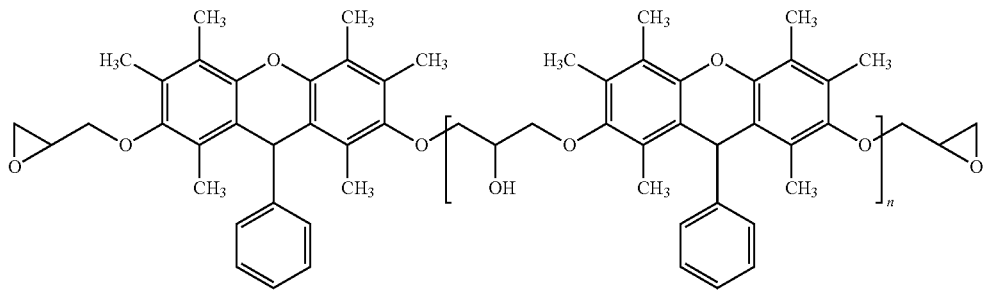

The resulting epoxy resin had an epoxy equivalent of 262 g/eq.

Synthesis Example 4

Synthesis of compound of Japanese Unexamined Patent Application, First Publication No. Hei 8-301980

In a 500 ml four-necked flask, 166 g (1.0 mols) of p-xylylene glycol dimethyl ether, 42.5 g (0.25 mols) of diphenyl ether and 12.5 g of p-toluenesulfonic acid were charged and then reacted in a nitrogen gas flow at 150° C. while stirring. Methanol produced during the reaction was removed out of the system. After about 3 hours, when 16 g of methanol was produced, 202.5 g (1.88 mols) of o-cresol was added and the reaction was further conducted at 150° C. for 2 hours. Subsequently, methanol produced during the reaction was removed out of the system. After the completion of the production of methanol, the reaction solution was neutralized with sodium carbonate and excess o-cresol was distilled off to obtain 237.5 g of a phenol resin (B-10). The resulting phenol resin had a softening point of 100° C. (B&R method), a melt viscosity (measuring method: ICI viscometer method, measured temperature: 150° C.) of 19 dPa·s and a hydroxyl group equivalent of 249 g/eq.

In the same manner as in Example 9, except that 249 g/eq (hydroxyl group: 1 equivalent) of a phenol resin obtained by the above method was used in place of the phenol resin (A-1), the epoxydation reaction was carried out to obtain an epoxy resin (E-7). The resulting epoxy resin had a softening point of 79° C. (B&R method) and an epoxy equivalent of 421 g/eq.

Examples 13 to 31 and Comparative Examples 1 to 3

Using the above epoxy resins (E-1) to (E-6), YX-4000H (tetramethyl biphenol type epoxy resin, epoxy equivalent: 195 g/eq) manufactured by Japan Epoxy Resins Co., Ltd., NC-3000 (biphenyl novolak type epoxy resin, epoxy equivalent: 274 g/eq) manufactured by Nippon Kayaku Co., Ltd. and EXA-4700 (naphthalene type epoxy resin, epoxy equivalent: 164 g/eq) manufactured by DAINIPPON INK & CHEMICALS Co., Ltd. as the epoxy resin; the avove phenol resins (A-1) to (A-8), XLC-LL (phenol aralkyl resin, hydroxyl group equivalent: 176 g/eq) manufactured by Mitsui Chemicals Co., Ltd. and MEH-7851SS (biphenyl novolak resin, hydroxyl group equivalent: 200 g/eq) manufactured by Meiwa Plastic Industries, Ltd. as the phenol resin; a comparative epoxy resin E-7; a comparative phenol resin A-9; triphenylphosphine (TPP) as the curing accelerator; condensed phosphate ester (PX-200, manufactured by Daihachi Chemical Industry Co., Ltd.) and magnesium hydroxide (Echomag Z-10, manufactured by Air Water Inc.) as the flame retardant; spherical silica (S—COL, manufactured by Micron Co., Ltd.) as the inorganic filler; γ-glycidoxytriethoxysilane (KBM-403, manufactured by SHIN-ETSU CHEMICAL CO., LTD.) as the silane coupling agent; carnauba wax (PEARL WAX No. 1-P, manufactured by Cerarica Noda Co. Ltd.); and carbon black according to the formulations shown in Tables 1 to 3, these components were melt-kneaded at a temperature of 85° C. for 5 minutes using a twin roll to obtain the objective compositions, and then curability was evaluated. Physical properties of the cured article were evaluated by the following procedure. That is, samples for evaluation were produced by the following method using the above compositions, and then heat resistance, flame retardancy and dielectric characteristics were determined by the following method. The results are shown in Tables 1 to 2.

<Heat Resistance>

Glass transition temperature was measured using a viscoelasticity measuring apparatus (solid viscoelasticity measuring apparatus RSAII manufactured by Rheometric Co., double cantilever method; frequency: 1 Hz, temperature raising rate: 3° C./min).

<Curability>

0.15 g of each epoxy resin composition was placed on a cure plate (manufactured by THERMO ELECTRIC Co., Ltd.) heated to 175° C. and time measurement was initiated using a stop watch. The sample was uniformly stirred using a bar. When it became possible to cut the sample into the form of string and they were remained on the plate, the stop watch was stopped. The time required for the sample to be cut and remained on the plate was taken as a gel time.

<Flame Retardancy>

Samples for evaluation, each measuring 12.7 mm in width, 127 mm in length and 1.6 mm in thickness were obtained by molding at a temperature of 175° C. for 90 seconds using a transfer molding machine and by curing at a temperature of 175° C. for 5 hours. Using 5 test samples having a thickness of 1.6 mm thus obtained, a combustion test was conducted in accordance with a UL-94 test method.

<Measurement of Dielectric Characteristics>

Samples for evaluation, each measuring 25 mm in width, 75 mm in length and 2.0 mm in thickness were obtained by molding at a temperature of 175° C. for 90 seconds using a transfer molding machine and curing at a temperature of 175° C. for 5 hours. Each of test samples thus obtained was bone-dried and then stored in a room at 23° C. and a humidity of 50% for 24 hours to obtain a cured article. The dielectric constant and dielectric dissipation factor at a frequency of 100 MHz of the resulting cured article were measured by a method defined in JIS-C-6481 using an impedance material analyzer "HP4291B" manufactured by Agilent Technology Co., Ltd.

TABLE 1

Formulation of epoxy resin composition (parts by mass) and evaluation results

| | | Examples | | | | | | | | | |
|---|---|---|---|---|---|---|---|---|---|---|---|
| | | 13 | 14 | 15 | 16 | 17 | 18 | 19 | 20 | 21 | 22 |
| Epoxy | E-1 | 79 | 75 | | | | | | | | |
| | E-2 | | | 71 | 72 | | | | 67 | | 66 |
| | E-3 | | | | | 83 | 84 | | | 83 | |
| | E-4 | | | | | | | 84 | | | |
| Curing agent | A-5 | | | | 62 | | 50 | | | | |
| | XLC-LL | 55 | | 63 | | 51 | | 50 | | 51 | 58 |
| | MEH-7851SS | | 59 | | | | | | 67 | | |
| Condensed phosphate ester | | | | | | | | | | | 30 |
| Magnesium hydroxide | | | | | | | | | 30 | 30 | |
| TPP | | 3 | 3 | 3 | 3 | 3 | 3 | 3 | 3 | 3 | 3 |
| Fused silica | | 850 | 850 | 850 | 850 | 850 | 850 | 850 | 820 | 820 | 830 |
| Coupling agent | | 5 | 5 | 5 | 5 | 5 | 5 | 5 | 5 | 5 | 5 |
| Carnauba wax | | 5 | 5 | 5 | 5 | 5 | 5 | 5 | 5 | 5 | 5 |
| Carbon black | | 3 | 3 | 3 | 3 | 3 | 3 | 3 | 3 | 3 | 3 |
| Curability | | 25 | 38 | 20 | 27 | 31 | 33 | 35 | 28 | 29 | 20 |
| Heat resistance | | 132 | 122 | 151 | 133 | 144 | 128 | 126 | 141 | 144 | 134 |
| Class of combustion test | | V-0 | V-0 | V-0 | V-0 | V-0 | V-0 | V-0 | V-0 | V-0 | V-0 |
| 1* | | 4 | 3 | 5 | 4 | 5 | 4 | 7 | 4 | 3 | 3 |
| 2* | | 18 | 14 | 23 | 18 | 21 | 16 | 24 | 16 | 13 | 11 |
| Dielectric constant | | 2.87 | 2.85 | 2.98 | 2.91 | 2.87 | 2.80 | 2.84 | 2.98 | 2.91 | 3.03 |
| Dielectric dissipation factor ($\times 10^{-4}$) | | 75 | 70 | 96 | 85 | 75 | 61 | 64 | 98 | 92 | 100 |

TABLE 2

Formulation of epoxy resin composition (parts by mass) and evaluation results

| | | Examples | | | | | | | | |
|---|---|---|---|---|---|---|---|---|---|---|
| | | 23 | 24 | 25 | 26 | 27 | 28 | 29 | 30 | 31 |
| Epoxy | E-2 | | | | | | | | | |
| | E-3 | 58 | 54 | 57 | | | | | | |
| | E-5 | | | 24 | 61 | 73 | | 46 | 61 | 57 |
| | E-6 | 25 | | | | | | | | |
| | NC-3000 | | | | | | | | | |
| | YX-4000H | | | | | | 19 | 20 | | |
| | EXA-4700 | | 23 | | | | 43 | | | |
| Curing agent | A-3 | | | | | 61 | 72 | 58 | | |
| | A-5 | | | | 43 | | | | | |
| | A-7 | | | | | | | | 73 | |
| | A-8 | | | | | | | | | 77 |
| | XLC-LL | 52 | 57 | 53 | | | | | | |
| | MEH-7851SS | | | | | | | | | |
| Condensed phosphate ester | | | | | | | | | | |
| Magnesium hydroxide | | | | | 30 | | | | | |
| TPP | | 3 | 3 | 3 | 3 | 3 | 3 | 3 | 3 | 3 |

TABLE 2-continued

Formulation of epoxy resin composition (parts by mass) and evaluation results

| | Examples | | | | | | | | |
|---|---|---|---|---|---|---|---|---|---|
| | 23 | 24 | 25 | 26 | 27 | 28 | 29 | 30 | 31 |
| Fused silica | 850 | 850 | 850 | 820 | 850 | 850 | 850 | 850 | 820 |
| Coupling agent | 5 | 5 | 5 | 5 | 5 | 5 | 5 | 5 | 5 |
| Carnauba wax | 5 | 5 | 5 | 5 | 5 | 5 | 5 | 5 | 5 |
| Carbon black | 3 | 3 | 3 | 3 | 3 | 3 | 3 | 3 | 3 |
| Curability | 34 | 26 | 28 | 23 | 26 | 22 | 31 | 37 | 39 |
| Heat resistance | 157 | 164 | 133 | 127 | 120 | 161 | 122 | 128 | 125 |
| Class of combustion test | V-0 | V-0 | V-0 | V-0 | V-0 | V-0 | V-0 | V-0 | V-0 |
| 1* | 6 | 6 | 6 | 6 | 5 | 4 | 7 | 3 | 3 |
| 2* | 26 | 31 | 29 | 25 | 23 | 20 | 36 | 15 | 13 |
| Dielectric constant | 2.89 | 3.01 | 2.92 | 2.89 | 2.98 | 2.96 | 2.88 | 2.83 | 2.80 |
| Dielectric dissipation factor ($\times 10^{-4}$) | 93 | 87 | 87 | 81 | 87 | 85 | 84 | 64 | 61 |

TABLE 3

Formulation of epoxy resin composition (parts by mass) and evaluation results

| | | Comparative Examples | | |
|---|---|---|---|---|
| | | 1 | 2 | 3 |
| Epoxy | E-5 | | | 81 |
| | E-7 | 94 | | |
| | NC-3000 | | 85 | |
| Curing agent | A-9 | | 49 | 53 |
| | XLC-LL | 40 | | |
| TPP | | 3 | 3 | 3 |
| Fused silica | | 850 | 850 | 850 |
| Coupling agent | | 5 | 5 | 5 |
| Carnauba wax | | 5 | 5 | 5 |
| Carbon black | | 3 | 3 | 3 |
| Curability | | 50 | 47 | 54 |
| Heat resistance | | 120 | 131 | 125 |
| Class of combustion test | | V-1 | V-1 | *3 |
| 1* | | 18 | 23 | 37 |
| 2* | | 107 | 146 | 143 |
| Dielectric constant | | 3.05 | 3.14 | 3.27 |
| Dielectric dissipation factor ($\times 10^{-4}$) | | 103 | 125 | 135 |

Notes of Tables 1 and 2:
*1: Maximum flame maintenance time for a single flame contact (seconds)
*2: Total flame maintenance time of 5 test samples (seconds)
Notes of Table 3:
*1: Maximum flame maintenance time for a single flame contact (seconds)
*2: Total flame maintenance time of 5 test samples (seconds)
*3: Samples do not satisfy flame retardancy ($\Sigma F \leq 250$ seconds and $F_{max} \leq 30$ seconds) required for V-1, but none of samples shows any ignition (arrival of flame at a clamp) while all resulted in extinction.

INDUSTRIAL APPLICABILITY

According to the present invention, there can be provided an epoxy resin composition capable of realizing low dielectric constant and low dielectric dissipation factor, which is suited for use as a latest high-frequency type electronic component-related material, while maintaining excellent heat resistance of a cured article thereof, and a cured article thereof, a novel phenol resin which imparts these performances, and a novel epoxy resin.

The invention claimed is:
1. An epoxy resin composition, comprising an epoxy resin and a curing agent as essential components, wherein the curing agent is a phenol resin which has respective structural units of:

a phenolic hydroxyl group-containing aromatic hydrocarbon group (P), an alkoxy group-containing condensed polycyclic aromatic hydrocarbon group (B), and a divalent hydrocarbon group (X) selected from methylene, an alkylidene group and an aromatic hydrocarbon structure-containing methylene group, and the phenol resin has, in a molecular structure, a structure in which the phenolic hydroxyl group-containing aromatic hydrocarbon group (P) and the alkoxy group-containing condensed polycyclic aromatic hydrocarbon group (B) are bonded via the divalent hydrocarbon group (X) selected from methylene, the alkylidene group and the aromatic hydrocarbon structure-containing methylene group, wherein no hydroxyl group is directly bonded to the alkoxy group-containing condensed polycyclic aromatic hydrocarbon group (B), wherein the alkoxy group-containing condensed polycyclic aromatic hydrocarbon group (B) is a structure selected from the group consisted of alkoxynaphthalene type structures represented by the following structural formulas B1 to B15, and an alkoxyanthracene structure represented by the following structural formula B16,

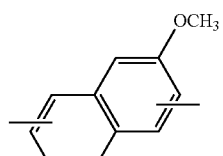

B1

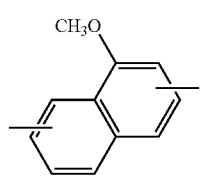

B2

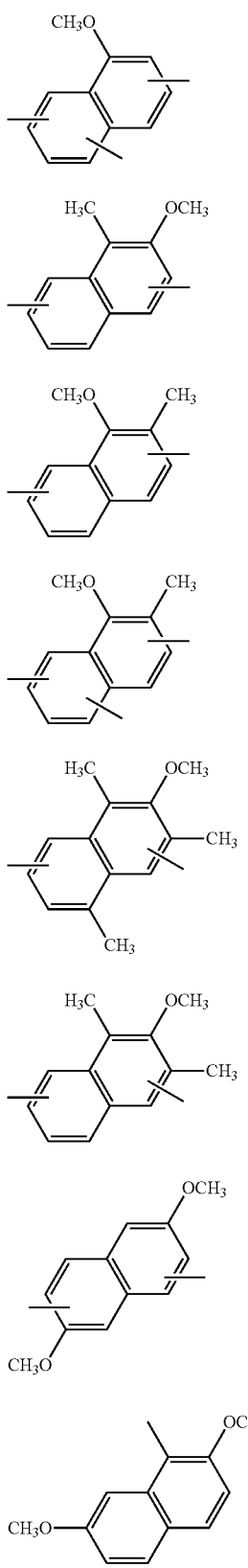

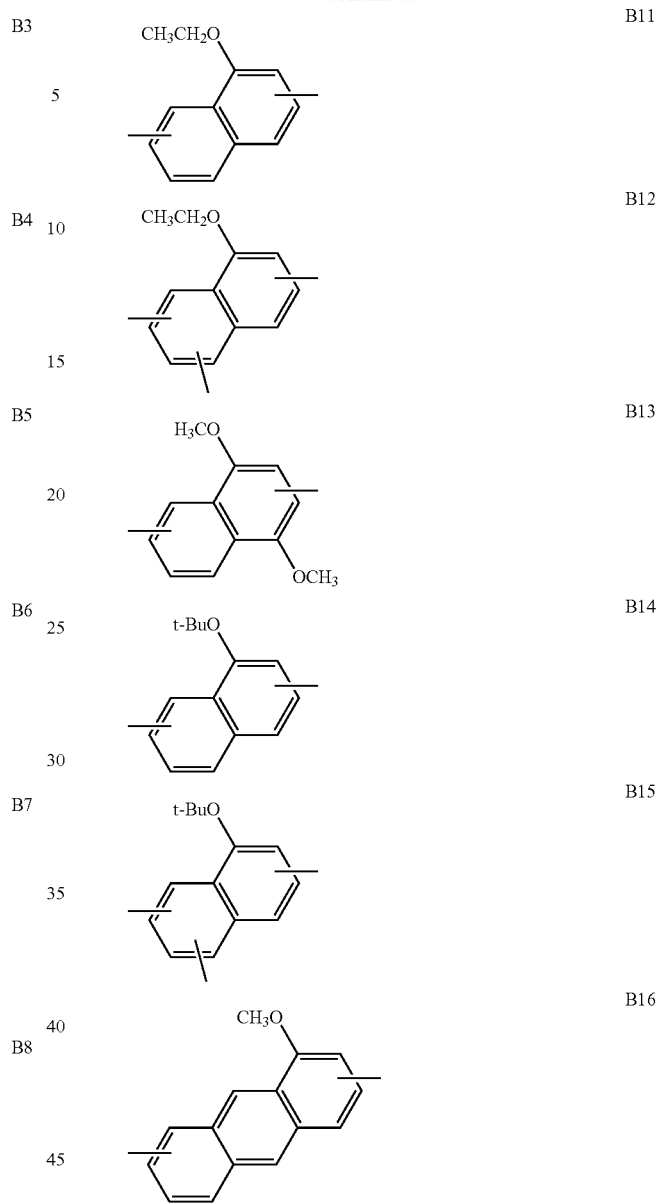

wherein
when the alkoxy group-containing condensed polycyclic aromatic hydrocarbon group (B) is located at the molecular end, a monovalent aromatic hydrocarbon group is formed.

2. The epoxy resin composition according to claim 1, wherein the phenol resin has, at a molecular end, a structural unit represented by the following structural formula:

B-X-     [Chemical Formula 1]

wherein B is a structural unit of the alkoxy group-containing condensed polycyclic aromatic hydrocarbon group (B), and X is a structural unit of the divalent hydrocarbon group (X) selected from methylene, the alkylidene group and the aromatic hydrocarbon structure-containing methylene group.

3. The epoxy resin composition according to claim 1, wherein the phenol resin has a melt viscosity at 150° C., as measured by an ICI viscometer in accordance with ASTM D4287, of 0.1 to 5.0 dPa·s.

4. The epoxy resin composition according to claim 1, wherein the phenol resin contains a compound having a structure represented by the following structural formula:

P-X-B-                                        [Chemical Formula 2]

wherein P is a structural unit of the phenolic hydroxyl group-containing aromatic hydrocarbon group (P), B is a structural unit of the alkoxy group-containing condensed polycyclic aromatic hydrocarbon group (B) and X is a structural unit of the divalent hydrocarbon group (X) selected from methylene, the alkylidene group and the aromatic hydrocarbon structure-containing methylene group, the content of the compound in the phenol resin being 1 to 30% by mass.

5. The epoxy resin composition according to claim 1, wherein the phenol resin is obtained by reacting a hydroxy group-containing aromatic compound (a1), an alkoxy group-containing condensed polycyclic aromatic compound (a2) and a carbonyl group-containing compound (a3), and the content of a compound represented by the following structural formula:

B-X-B                                       [Chemical Formula 3]

wherein B is a structural unit of the alkoxy group-containing condensed polycyclic aromatic hydrocarbon group (B) and X is a structural unit of the divalent hydrocarbon group (X) selected from methylene, the alkylidene group and the aromatic hydrocarbon structure-containing methylene group, in the phenol resin is 5% by mass or less.

6. An epoxy resin cured article obtained by curing the epoxy resin composition according to any one of claims 1 to 5.

7. A semiconductor encapsulation material comprising the epoxy resin composition according to any one of claims 1 to 5 which further contains, in addition to the epoxy resin and the curing agent, an inorganic filler within a range of 70 to 95% by mass with respect to the epoxy resin composition.

8. A novel phenol resin, including respective structural units of:
a phenolic hydroxyl group-containing aromatic hydrocarbon group (P),
an alkoxy group-containing condensed polycyclic aromatic hydrocarbon group (B), and
a divalent hydrocarbon group (X) selected from methylene, an alkylidene group and an aromatic hydrocarbon structure-containing methylene group, wherein the phenol resin has, in a molecular structure, a structure in which the phenolic hydroxyl group-containing aromatic hydrocarbon group (P) and the alkoxy group-containing condensed polycyclic aromatic hydrocarbon group (B) are bonded via the divalent hydrocarbon group (X) selected from methylene, the alkylidene group and the aromatic hydrocarbon structure-containing methylene group, and the phenol resin has a melt viscosity at 150° C., as measured by an ICI viscometer in accordance with ASTM D4287, of 0.1 to 5.0 dPa·s and a hydroxyl group equivalent of 120 to 500 g/eq,
wherein no hydroxyl group is directly bonded to the alkoxy group-containing condensed polycyclic aromatic hydrocarbon group (B)
wherein the alkoxy group-containing condensed polycyclic aromatic hydrocarbon group (B) is a structure selected from the group consisted of alkoxynaphthalene type structures represented by the following structural formulas B1 to B15, and an alkoxyanthracene structure represented by the following structural formula B16,

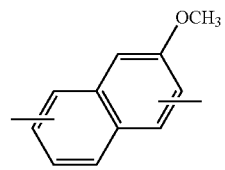

B1

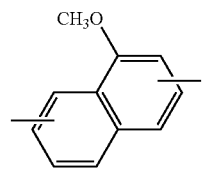

B2

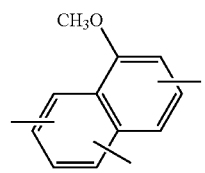

B3

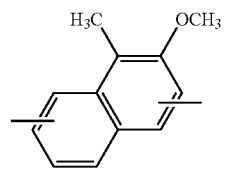

B4

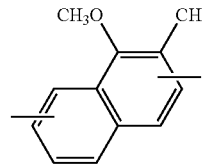

B5

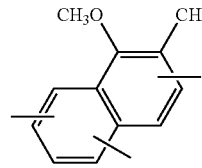

B6

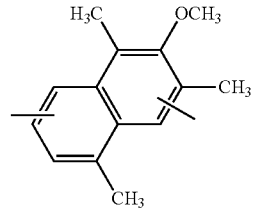

B7

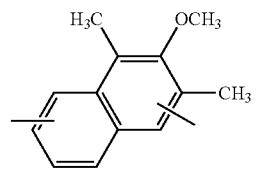

B8

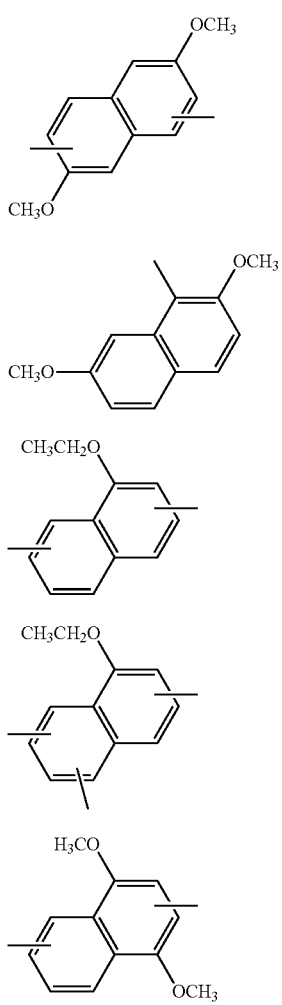
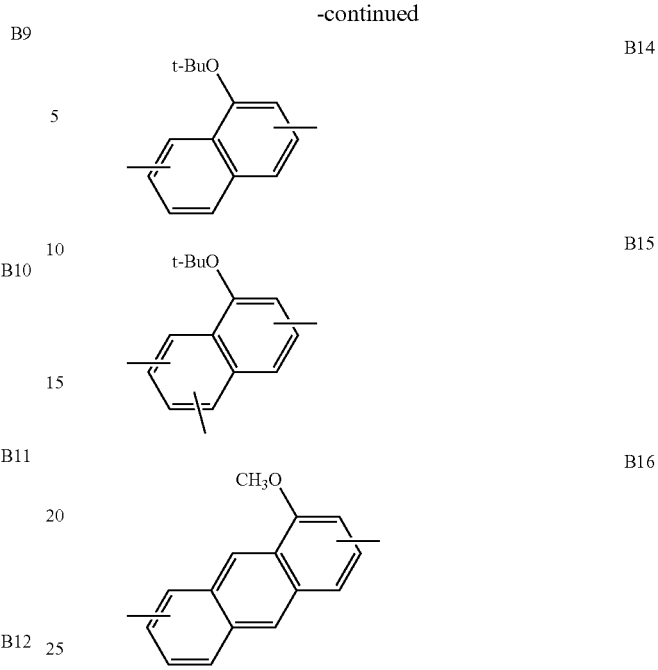
wherein
when the alkoxy group-containing condensed polycyclic aromatic hydrocarbon group (B) is located at the molecular end, a monovalent aromatic hydrocarbon group is formed.
* * * * *